US009777371B2

(12) United States Patent
Coutu et al.

(10) Patent No.: US 9,777,371 B2
(45) Date of Patent: Oct. 3, 2017

(54) ALD SYSTEMS AND METHODS

(75) Inventors: Roger R. Coutu, Hooksett, NH (US);
Jill Svenja Becker, Cambridge, MA (US); Ganesh M. Sundaram, Concord, MA (US); Eric W. Deguns, Somerville, MA (US)

(73) Assignee: Ultratech, Inc., San Jose, CA (US)

( * ) Notice: Subject to any disclaimer, the term of this patent is extended or adjusted under 35 U.S.C. 154(b) by 1017 days.

(21) Appl. No.: 13/203,602

(22) PCT Filed: Feb. 26, 2010

(86) PCT No.: PCT/US2010/000590
§ 371 (c)(1),
(2), (4) Date: Nov. 8, 2011

(87) PCT Pub. No.: WO2010/098875
PCT Pub. Date: Sep. 2, 2010

(65) Prior Publication Data
US 2012/0064245 A1 Mar. 15, 2012

Related U.S. Application Data

(60) Provisional application No. 61/208,875, filed on Feb. 27, 2009.

(51) Int. Cl.
*C23C 16/455* (2006.01)
*C23C 16/44* (2006.01)

(52) U.S. Cl.
CPC .... *C23C 16/4401* (2013.01); *C23C 16/45504* (2013.01); *C23C 16/45546* (2013.01); *C23C 16/45582* (2013.01)

(58) Field of Classification Search
CPC .......... C23C 16/4401; C23C 16/45582; C23C 16/45546; C23C 16/45504; H01J 37/32449
See application file for complete search history.

(56) References Cited

U.S. PATENT DOCUMENTS 4,340,462 A * 7/1982 Koch .................. 204/298.35
5,221,556 A * 6/1993 Hawkins et al. ........ 427/255.17
(Continued)

FOREIGN PATENT DOCUMENTS

CN 1342213 3/2002
CN 1628368 2/2003
(Continued)

OTHER PUBLICATIONS

PCT/US2010/000590, Aug. 25, 2010, Search Report.
(Continued)

*Primary Examiner* — Gordon R Baldwin
*Assistant Examiner* — Yuechuan Yu
(74) *Attorney, Agent, or Firm* — Royse Law Firm, PC

(57) ABSTRACT

A gas deposition system (1000) configured as a dual-chamber "tower" includes a frame (1140) for supporting two reaction chamber assemblies (3000), one vertically above the other. Each chamber assembly (3000) includes an outer wall assembly surrounding a hollow chamber (3070) sized to receive a single generation 4.5 (GEN 4.5) glass plate substrate through a load port. The substrate is disposed horizontally inside the hollow chamber (3070) and the chamber assembly (3000) includes removable and cleanable triangular shaped input (3150) and output (3250) plenums disposed external to the hollow chamber (3070) and configured to produce substantially horizontally directed laminar gas flow over a top surface of the substrate. Each chamber includes a cleanable and removable chamber liner assembly (6000) disposed inside the hollow chamber (3070) to contain precursor gases therein thereby preventing contamination of chamber outer walls (3010, 3020, 3030, 3040).

12 Claims, 18 Drawing Sheets

(56) References Cited

U.S. PATENT DOCUMENTS

| | | | |
|---|---|---|---|
| 5,788,799 A | | 8/1998 | Steger et al. |
| 5,879,459 A | | 3/1999 | Gadgil et al. |
| 6,143,079 A | * | 11/2000 | Halpin ............... 118/715 |
| 7,163,587 B2 | | 1/2007 | Kinnard et al. |
| 7,399,499 B2 | | 7/2008 | Basceri |
| 2001/0011526 A1 | | 8/2001 | Doering et al. |
| 2001/0032588 A1 | * | 10/2001 | Harafuji et al. ............. 118/715 |
| 2002/0182131 A1 | * | 12/2002 | Kaushal et al. ............. 422/198 |
| 2003/0079689 A1 | * | 5/2003 | Sumakeris et al. ......... 118/725 |
| 2003/0150560 A1 | | 8/2003 | Kinnard et al. |
| 2003/0194829 A1 | * | 10/2003 | Carpenter et al. ........... 438/100 |
| 2004/0245098 A1 | * | 12/2004 | Eckerson ............. 204/298.01 |
| 2005/0183827 A1 | | 8/2005 | White et al. |
| 2005/0268857 A1 | * | 12/2005 | Bang et al. .................. 118/733 |
| 2006/0021573 A1 | | 2/2006 | Monsma et al. |
| 2006/0054090 A1 | * | 3/2006 | Kurita et al. ................ 118/728 |
| 2006/0216416 A1 | * | 9/2006 | Sumakeris et al. ........ 427/248.1 |
| 2006/0264045 A1 | * | 11/2006 | Gu et al. ..................... 438/680 |
| 2006/0266289 A1 | | 11/2006 | Verghese et al. |
| 2007/0051312 A1 | | 3/2007 | Sneh |
| 2007/0107653 A1 | * | 5/2007 | Yamada .......................... 117/84 |
| 2007/0134894 A1 | * | 6/2007 | Chandler et al. ............ 438/510 |
| 2007/0207267 A1 | | 9/2007 | Laube |
| 2007/0221128 A1 | | 9/2007 | Choi et al. |
| 2008/0118663 A1 | | 5/2008 | Choi et al. |
| 2008/0220150 A1 | * | 9/2008 | Merry ............... C23C 16/45591 427/8 |
| 2010/0047447 A1 | * | 2/2010 | Cook ................ C23C 16/45563 427/248.1 |
| 2010/0272892 A1 | * | 10/2010 | Kobayashi ........ C23C 16/45574 427/255.5 |

FOREIGN PATENT DOCUMENTS

| | | | |
|---|---|---|---|
| CN | 101040060 | | 9/2007 |
| FR | 2661554 | | 10/1991 |
| GB | 2426252 | | 11/2006 |
| JP | 61095510 A | * | 5/1986 |
| JP | 61174624 A | * | 8/1986 |
| JP | 1108723 | | 4/1989 |
| JP | 05077934 U | * | 10/1993 |
| JP | 06112140 A | * | 4/1994 |
| JP | 06232049 A | * | 8/1994 |
| JP | 07094419 A | * | 4/1995 |
| JP | H1070112 | | 3/1998 |
| JP | 2002305186 A | * | 10/2002 |
| JP | 2004091848 | | 3/2004 |
| JP | 2007027791 | | 2/2007 |
| WO | WO 00/40772 | | 7/2000 |
| WO | WO 2007/001301 | | 1/2007 |

OTHER PUBLICATIONS

EP10746561.9, Nov. 13, 2012, Communication.
International Search Report from PCT/US2010/000590, dated Aug. 25, 2010.
Communication from EP10746561.9, dated Nov. 13, 2012.

* cited by examiner

DUAL CHAMBER TOWER

AUTOMATED PRODUCTION FACILITY

CHAMBER ASSEMBLY - 1

CHAMBER ASSEMBLY - 2

CHAMBER ASSEMBLY - 3

OUTER WALL ASSEMBLY

WELDED CHAMBER LINER ASSEMBLY

LIFT PIN CUTAWAY VIEW

DOUBLE WIDE CHAMBER

DUAL CHAMBERS WITH SHARED PRECURSOR
AND VACUUM SYSTEMS

DUAL CHAMBERS CONNECTED IN SERIES

RECTANGULAR CONDUIT

TRAPS IN SERIES

TRAPS IN SERIES

TRAPS IN PARALLEL

ALD SYSTEMS AND METHODS

CROSS REFERENCE TO RELATED U.S. PATENT APPLICATIONS

The present application is a U.S. National Stage application based on International Application No. PCT/US2010/000590, filed Feb. 26, 2010, which claims priority to U.S. Provisional Patent Application Ser. No. 61/208,875 filed Feb. 27, 2009, both of which are incorporated herein by reference in their entireties and for all purposes.

COPYRIGHT NOTICE

A portion of the disclosure of this patent document may contain material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice shall apply to this document: Copyright 2009, Cambridge NanoTech, Inc.

BACKGROUND OF THE INVENTION

Field of the Invention

The exemplary, illustrative, technology herein relates to atomic layer deposition (ALD) systems and operating methods thereof and to gas deposition chamber and subsystem configurations that are compatible with robotic large substrate loading and unloading, with autonomous ALD coating operations, and with generating desired gas flow patterns over large rectangular substrates as well as extending the operating time between maintenance procedures so as to enhance production rates.

The technology herein has applications in the areas of producing single or multiple material monolayer coatings such as those useful for constructing Liquid Crystal Display (LCD) devices.

The Related Art

Gas, or vapor, deposition is a method for creating thin material layers (coating) on surfaces that involves exposing a solid substrate surface to a gas or vapor, hereinafter a gas, in order to deposit a thin material layer onto the solid surface, referred to herein as a "substrate". Various gas deposition methods are known, and several are commonly used in semiconductor manufacture, for the fabrication of integrated circuits, and the like. More generally, gas deposition methods are used to form thin films onto a wide range of substrates to modify the surface properties thereof. In practice, gas deposition methods are performed by placing a solid substrate into a gas deposition chamber, also referred to herein as a "reaction chamber", and exposing the solid substrate to one or more gases. The gases react with exposed surfaces of the solid substrate to deposit or otherwise form a new material layer thereon. Generally the material layer is formed by a chemical reaction between the gas and the substrate surface such that the film layer forms atomic bonds with the substrate surface.

Many commercial facilities are moving to add Atomic Layer Deposition (ALD) coating systems into existing material processing workflows to coat semiconductor wafers, glass substrates such as liquid crystal display substrate blanks, and the like. ALD processing methods are used to coat atomic level material monolayers onto exposed substrate surfaces using at least two gas deposition steps with each gas deposition step producing a sub-monolayer. In practice the substrate is inserted into a gas deposition, or reaction, chamber, and the chamber is evacuated to remove air, water vapor, and other contaminants therefrom before a first precursor gas is introduced into the chamber. The first precursor chemically reacts with exposed surfaces of the substrate as well as with every other exposed surface of the chamber and any other hardware surfaces and the reaction forms a first sub-monolayer. The first precursor is then flushed from the chamber and a second precursor gas is introduced. The second precursor reacts with the first sub-monolayer. The reaction of the first sub-monolayer with the second precursor gas completes the formation of a material monolayer onto the exposed substrate surfaces. The second precursor is then flushed from the chamber. Both precursor reactions are self-limiting in that once the precursor has reacted with all of the available reaction sites, the reaction stops. Accordingly ALD coatings are substantially uniform with a predictable material thickness that is substantially non-varying over the entire substrate and, depending upon cycle times, may produce uniform coating thicknesses even over the surfaces of very high aspect ratio micron-sized surface features. The second precursor reaction also creates a surface molecule that will react with the first precursor gas to form another sub-monolayer. Accordingly, the ALD process can be repeated indefinitely to build up a desired material coating thickness on the exposed substrate surfaces with a high degree of precision and purity.

Some advantages of the ALD process over various other gas deposition methods include: precise control over monolayer thickness, material coating uniformity; relatively low process temperature windows (e.g. less than 400° C.); low precursor gas consumption; high quality films; and the ability to ultimately control the total material coating thickness by controlling the number of coating cycles performed.

Some of the disadvantages of the ALD process include: a decrease in substrate throughput rate because the ALD process requires two deposition cycles per monolayer; a limited number of precursors suitable for use in coating in the ALD process and therefore a limited number of materials that can be used for ALD thin film coating; and the tendency for the ALD reactants to form coatings on every surface that is exposed to them, including the reaction chamber walls, gas flow conduits, pumps, valves, and other surfaces, and this results in continuous material buildup over time. It is a particular problem with ALD reaction chambers that ALD material layers built up on the coating chamber and other equipment over time can have adverse affects of interfering with heat transfer, flaking off and contaminating substrates, interfering with sensor readings, and damaging moving parts (e.g. in pumps, valves, and other hardware). Moreover the precursor gases tend to be highly corrosive, sometimes volatile, and usually harmful to human operators. Accordingly, precursor gases require careful handling containment. In addition, many applications require high purity precursor gasses be used to ensure that the desired electrical properties of the coating materials are not degraded by precursor contaminants, and high purity precursor gasses are expensive.

One solution to reducing precursor use is to inject low volumes of precursor gas into the chamber using precise mass flow rate control valves in the precursor gas supply line. A solution to eliminating precursor gas from the gas outflow of the deposition chamber is to install a precursor trap in the exit port. Examples of both of these devices are disclosed in co-pending and commonly assigned U.S. patent application Ser. No. 11/167,570 filed on Jun. 27, 2005 entitled VAPOR DEPOSITION SYSTEM AND METH- ODS which is incorporated herein by reference in its entirety and for all purposes. While these solutions are helpful, they do not solve the problem that exposed surfaces of the ALD deposition chamber are coated during every coating cycle and periodically need to be replaced or cleaned (e.g. by an acid etch or the like).

A further problem with advancing ALD coating systems to commercially viable operation is the need to increase the chamber size as required to coat larger substrates and particularly large rectangular glass substrates as may be used for LCD displays. In particular, there are a number of engineering challenges to overcome to develop a large rectangular ALD chamber, because the chamber itself is a deep vacuum vessel capable of achieving vacuum pressures of less than 10 microtorr, and possibly less than 1 microtorr, without leaking or collapsing while also requiring a large port and associated access door for delivering a substrate into the chamber for coating. In addition, it is a challenge to handle loading and unloading of the large substrates, which are at elevated temperatures, as well as to quickly heat the chamber and substrate between load cycles and to keep the substrates free from contamination. It is a further challenge to provide a safe operating environment for users and to clean and repair the chamber without excessive impact on the overall material processing workflow.

One solution to keeping the chamber free of ALD coating layers is to install a removable and cleanable liner, such as a stainless steel liner, inside the ALD chamber to contain precursor gases and therefore prevent coating layers from forming on inside surfaces of the ALD chamber which is usually an aluminum structure due to the need for high thermal conductivity through the inside chamber walls. Such a liner can be removed from the chamber, cleaned by an acid etch or the like, and then reinstalled into the chamber. One such removable liner is disclosed in co-pending and commonly assigned U.S. Provisional Patent Application No. 61/197,948 filed on Nov. 1, 2008 entitled GAS DEPOSITION CHAMBER WITH REMOVABLE LINER which is incorporated herein by reference in its entirety and for all purposes.

A further problem with advancing ALD coating systems to commercially viable operation is the need to reduce coating cycle time and this includes the time required to load and unload a substrate, to heat the chamber and substrate to the deposition temperature, to pump the chamber to deep vacuum, to purge contaminants from the chamber, to expose the substrate to precursor gases and to flush the precursor gases out of the chamber. Applicants have found that cycle time can be reduced when the substrate is exposed to a laminar gas flow substantially over its entire coating surface and that this can be accomplished by controlling the velocity and path of input gasses by careful design of an input plenum that distributes the gas over the width of a substrate and reduces the gas velocity.

A further problem with advancing ALD coating systems to commercially viable operation is the need to fit ALD coating systems into existing production facilities where floor space is at premium. Accordingly, there is a need in the art for an ALD production coating device that provides high coating throughput in a small floor space footprint.

SUMMARY OF THE INVENTION

These and other problems are addressed by the present invention, which provides a gas deposition system (1000) configured as a dual-chamber "tower", including a frame (1140) for supporting two reaction chamber assemblies (3000), one vertically above the other. The present invention further provides a gas deposition chamber (3000) and associated gas control systems configured to deposit thin film layers onto exposed surfaces of a solid substrate (7000) by one or more gas deposition processes. Each deposition chamber assembly (3000) is configured as an atomic layer deposition (ALD) system suitable for delivering a plurality of different ALD reactants or "precursors" into a hollow rectangular chamber (3070) configured to support a large rectangular glass substrate (7000) on a substantially horizontal substrate support surface (3350).

The precursors are introduced into the hollow rectangular chamber (3070) through an input plenum (3150) which includes a precursor input port (3230) and a gas supply module (3240). Precursors are removed from the hollow rectangular chamber (3070) through an output plenum (3250) which includes an exit port (3310) and an exit port module (3320) which is in fluid communication with a vacuum pump (not shown). Each deposition chamber (3000) includes a system controller for operating the gas supply module and the vacuum pump according to program steps stored in the system controller. Alternately one system controller can be used to control both deposition chamber assemblies (3000). ALD and other coating sequences are performed according to coating recipes which are stored in a system controller. Alternately a user may enter recipe data using a user interface module (1200) associated with the system controller.

The exemplary dual-chamber tower (1000) is configured to communicate with a robotic substrate handler (2010) which functions to transport one uncoated substrate at a time from substrate storage racks (2020) to selected chamber assemblies (3000). After the substrate is coated, the robotic substrate handler (2010) functions to transport one coated substrate at a time back to a storage rack.

Preferably each chamber (3000) is configured with a front facing movable access door (3080) that faces the robotic substrate handler (2010). The access door (3080) moves vertically downward to provide access to the chamber and moves vertically upward to vacuum seal the chamber. Each chamber is sized to receive a single generation 4.5 (GEN 4.5) glass plate substrate through the load port. Alternately, the hollow rectangular chamber (3070) may be used to coat one or more than one smaller glass substrates such as GEN 1.0 through GEN 4.0.

Each chamber assembly (3000) includes a cleanable and removable chamber liner assembly (6000) disposed inside the hollow rectangular chamber (3070) to contain precursor gases therein thereby preventing contamination of chamber outer walls (3010, 3020, 3030, 3040). To help contain precursor gas inside the chamber liner assembly (6000), a purge gas is injected into upper and lower hollow volumes (7090) and (7100) between the chamber liner assembly (6000) and the outer chamber walls. In addition each of the input plenums (3150) and output plenums (3250) are also cleanable and removable. Each chamber (3000) also includes cleanable and removable plenum liners (7010) and (7080) disposed to extend from corresponding input and output plenums in the chamber liner assembly (6000). Each of the removable and cleanable elements comprises stainless steel walls that can be acid etched to remove built up ALD coating layers.

Each chamber assembly (3000) is configured with module plenum flanges (3160) and (3260) made for modular exchange or interchange of various input and output plenums as required for different applications or to allow rapid plenum exchange during a routine service call for maintenance or cleaning.

Each chamber assembly (3000) includes a moveable pin plate (7130) formed with a plurality of fixed lift pins (7120) attached thereto and disposed with top surfaces of the lift pins forming a substantially horizontal substrate support surface. The pin plate is moved along a vertical axis by a pin actuator assembly (3390) which is housed outside the hollow rectangular chamber (3070). The bottom wall of the chamber liner assembly (6000) includes through holes (7110) corresponding with the location of each of the plurality of lift pins such that vertical movement of the pin plate to an up position lifts a substrate off of the substrate support surface (3350) by a dimension (D) to separate the substrate from the substrate support surface for removal from the chamber. Similarly, with the pin plate in the up position, a substrate may be loaded onto the tops of the lift pins. When the pin plate is lowered to a down position the pin tops are lowered below the substrate support surface (3350) and the substrate is lowered into contact with the substrate support surface (3350).

In some embodiment of the present invention the two chamber assemblies may be driven by one gas supply module and evacuated by one vacuum pump and the system controller includes program steps suitable for performing substantially simultaneous coating cycles in both chambers.

In some embodiments a precursor trap (10140) may be disposed in the exit port module (3320). In further embodiments one or more additional trap elements may be disposed between the exit port and the vacuum pump.

These and other aspects and advantages will become apparent when the Description below is read in conjunction with the accompanying Drawings.

Figure 1:
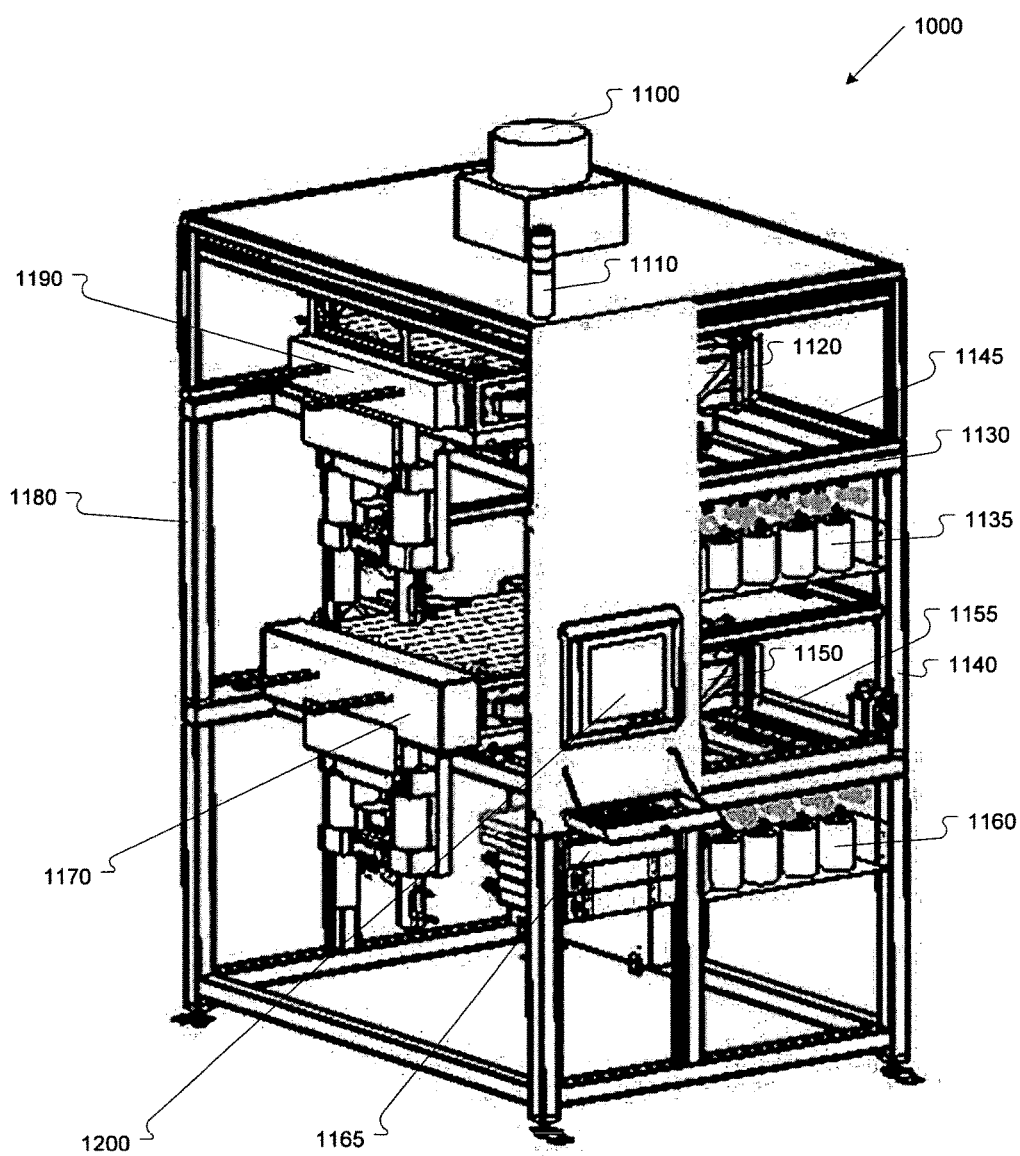
FIG. 1 depicts an isometric view showing a dual chamber gas deposition system without external skins according to the present invention.

| 1.8 List of Item Reference Numbers | |
|---|---|
| 1000 | Dual Chamber Gas Deposition System |
| 1100 | Vent |
| 1110 | Lighting Tower |
| 1120 | Upper Chamber |
| 1130 | Right Face |
| 1135 | Upper precursor supply |
| 1140 | Frame |
| 1145 | Upper cross platform |
| 1150 | Bottom Chamber |
| 1155 | Bottom cross platform |
| 1160 | Bottom precursor supply |
| 1165 | Electronic controller |
| 1170 | Bottom load port |
| 1180 | Front face |
| 1190 | Upper load port |
| 1200 | User interface |
| 2000 | Automated gas deposition production facility |
| 2010 | Robotic substrate handler |
| 2020 | Substrate storage racks |
| 2030 | Robotic base |
| 2040 | Manipulator arm |
| 2050 | Lifting elements |
| 2060 | Clean room |
| 2070 | Wall panels |
| 2080 | Wall ports |
| 3000 | Chamber Assembly |
| 3010 | Top outer wall |
| 3020 | Bottom outer wall |
| 3030 | Left outer wall |
| 3035 | Front aperture |
| 3040 | Right outer wall |
| 3042 | Front outer wall |
| 3045 | Back aperture |
| 3044 | Back outer wall |
| 3050 | Back panel |
| 3060 | Perimeter flange |
| 3070 | Hollow rectangular chamber |
| 3080 | Movable access door |
| 3090 | Support bracket |
| 3100 | Door Actuators |
| 3110 | Electric heaters |
| 3120 | Thermal Insulation |
| 3125 | Chamber eye bolts |
| 3130 | Right rectangular aperture |
| 3140 | Left rectangular aperture |
| 3150 | Input plenum |
| 3160 | Input plenum flange |
| 3170 | Top input plenum wall |

| 1.8 List of Item Reference Numbers | |
|---|---|
| 3180 | Bottom input plenum wall |
| 3190 | Input plenum side wall |
| 3200 | Input plenum side wall |
| 3210 | Input plenum chamber |
| 3220 | Input plenum end wall |
| 3230 | Input port |
| 3240 | Gas supply module |
| 3250 | Output plenum |
| 3260 | Output plenum flange |
| 3270 | Top output plenum wall |
| 3280 | Bottom output plenum wall |
| 3290 | Output plenum side wall |
| 3300 | Output plenum chamber |
| 3310 | Exit Port |
| 3320 | Exit port module |
| 3330 | Stop valve |
| 3340 | Vacuum pressure gauge |
| 3350 | Substrate support surface |
| 3360 | Back panel eye bolts |
| 3370 | Cone-shaped passage |
| 3380 | Liner fasteners |
| 3390 | Pin actuator assembly |
| 3400 | Lift post |
| 3410 | Cylinder and piston assembly |
| 3420 | Vacuum bellows |
| 3430 | Through hole |
| 3440 | Guide rods |
| 3450 | Stiffening Fins |
| 6000 | Liner assembly |
| 6010 | Bottom liner wall |
| 6020 | Top liner wall |
| 6030 | Front liner aperture |
| 6040 | Back liner wall |
| 6050 | Right liner aperture |
| 6060 | Left liner aperture |
| 6070 | Liner handle |
| 6080 | Tooling ball |
| 6090 | Rectangular back aperture |
| 7000 | Substrate |
| 7010 | Substrate support surface |
| 7015 | Input plenum liner |
| 7020 | Top plenum liner wall |
| 7030 | Bottom plenum liner wall |
| 7040 | Back plenum liner wall |
| 7050 | Flange |
| 7060 | Bottom wall top surface |
| 7080 | Output plenum liner |
| 7090 | Upper volume |
| 7100 | Lower volume |
| 7110 | Through hole |
| 7120 | Lift pin |
| 7130 | Movable pin plate |
| D | Pin height dimension |
| 8000 | Lift pin assembly |
| 8010 | Metal shaft |
| 8020 | Tip attachment |
| 8030 | Spherical end |
| 8100 | Reaction chamber assembly |
| 8110 | Outer wall assembly |
| 8120 | Hollow chamber |
| 8130 | Substrate support shelf |
| 8140 | Left support area |
| 8150 | Right support area |
| 8160 | Input plenum |
| 8170 | Output plenum |
| 8180 | Exit port module |
| 8190 | Right aperture |
| 8210 | Left aperture |
| 8220A, B, C | Support bracket |
| 8230 | Substrate |
| 8240 | Shoulder |
| 8250 | Electrical connector |
| 8260 | Removable liner |
| 9000 | Double wide chamber assembly |
| 9010 | Substrate |
| 9020 | Substrate |
| 9030 | Double wide access door |

| 1.8 List of Item Reference Numbers | |
|---|---|
| 10000 | Dual chamber system |
| 10010 | Chamber assembly |
| 10020 | Chamber assembly |
| 10030 | Gas supply module |
| 10040 | Input conduit |
| 10050 | Top input plenum |
| 10060 | Bottom input plenum |
| 10070 | Stop valve |
| 10080 | Output conduit |
| 10090 | Top output plenum |
| 10100 | Bottom output plenum |
| 10110 | Top exit port module |
| 10120 | Bottom exit port module |
| 10130 | Stop valve |
| 10140 | Precursor trap |
| 11000 | Dual Chamber System |
| 11010 | Top Chamber |
| 11020 | Bottom chamber |
| 11030 | Input plenum |
| 11140 | Gas supply module |
| 11050 | Output plenum |
| 11060 | Exit port module |
| 12000 | Rectangular conduit assembly |
| 12010 | Upper flange/port |
| 12020 | Lower flange/port |
| 12030 | Rectangular fluid conduit |
| 13010 | Output plenum |
| 13020 | Exit plenum |
| 13030 | 1$^{st}$ Precursor trap |
| 13040 | Auxiliary precursor trap |
| 13050 | Stop valve |
| 13060 | Second Trap |
| 13070 | T-fitting |
| 13080 | Stop valve |
| 13090 | Stop valve |
| 13120 | Left conduit |
| 13130 | Right conduit |
| 13140 | Auxiliary precursor trap |
| 13150 | Auxiliary precursor trap |
| 13160 | Second Trap |

DETAILED DESCRIPTION OF THE INVENTION

Frame Control System Gas Supply System and FIG. 1

Figure 3:
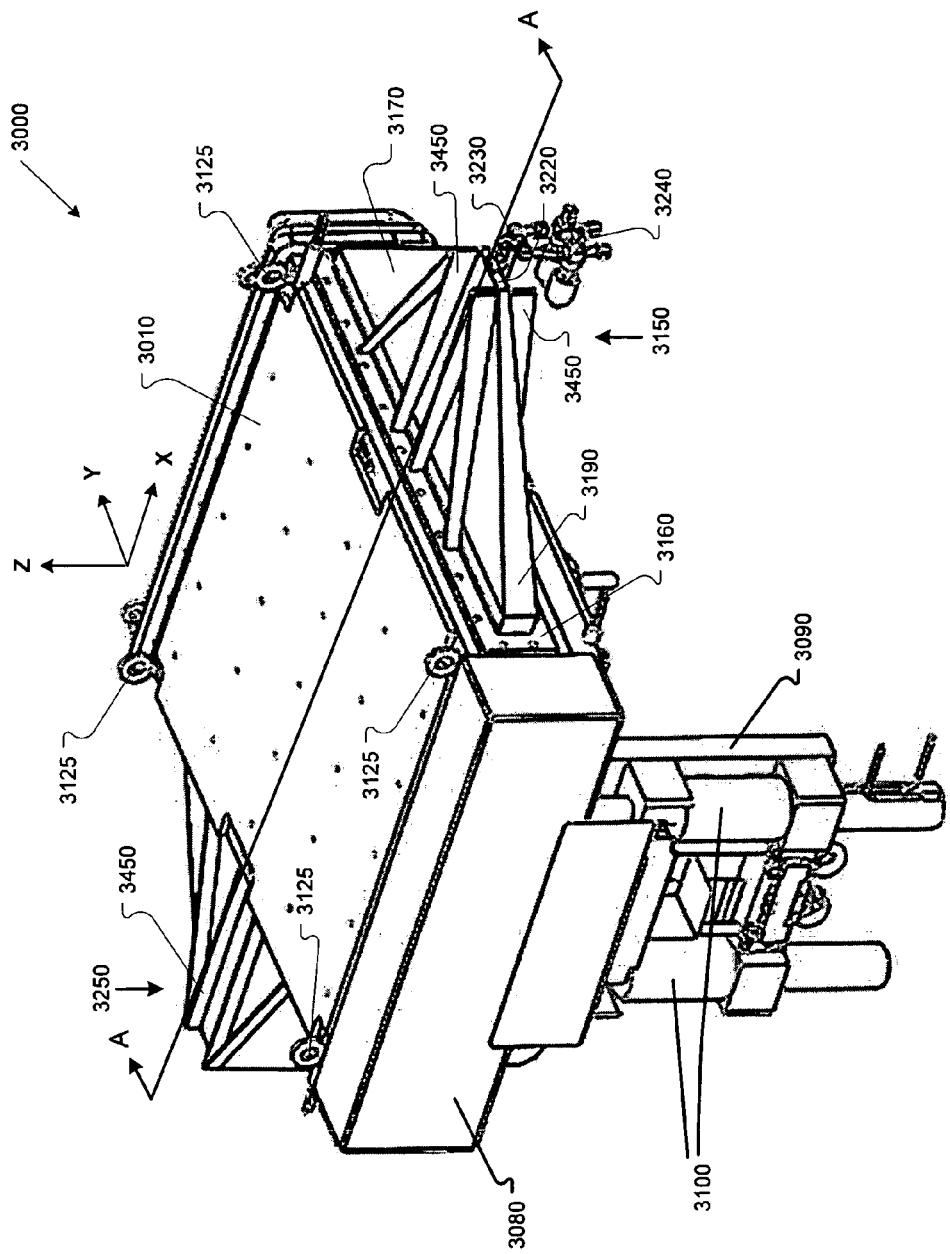
FIG. 3 depicts a front isometric front view of a gas deposition chamber assembly according to the invention.

Referring to FIG. 1, a preferred exemplary implementation of a dual chamber gas deposition system (1000) according to the present invention is shown in isometric view with the external skins removed. The system (1000) includes a front face (1180) which is used for loading substrates into each of two gas deposition chambers (1120) and (1150). A right side face (1130) includes a single user interface device (1200) which can be used to enter commands for operating both of the gas deposition chambers (1120) and (1150). In alternate embodiments, each gas deposition chamber may include a separate user interface device (1200). In further alternate embodiments, the control systems of both gas deposition chambers can be networked to a remote device that includes a remote user interface, not shown. The system (1000) comprises a frame (1140) constructed to support an upper ALD reaction chamber (1120) supported by an upper cross frame platform (1145) and a lower ALD reaction chamber (1150) supported by a lower cross frame platform (1155). Each of the chambers (1120) and (1150) is constructed to receive a single large area rectangular substrate therein and to support the substrate in a substantially horizontal plane. In particular, the preferred substrate size is a GEN 4.5 glass substrate which has rectangular dimensions of 920 mm wide by 730 mm deep and the chambers (1120) and (1150) are configured with a front opening or load port having a width dimension along an x-axis that is larger than 730 mm for receiving the substrate width dimension through the front port. Accordingly, the longitudinal length of the chamber along a Y-axis, defined in FIG. 3, is greater than 920 mm to receive the GEN 4.5 substrate therein. Alternately, the chamber assembly can be configured to receive substrates in another orientation. Each substrate comprises a top face, to be coated, and an opposing bottom face that is not coated. The substrates have an approximate thickness of 0.5 mm, and are therefore fragile and difficult to handle. The glass substrates are used to manufacture rectangular LCD screens and the like. The chamber includes a horizontal substrate support surface for receiving a bottom face of a substrate thereon with an opposing top face of the substrate top face facing upward. Generally one GEN 4.5 substrate is loaded into a chamber at a time for coating; however, a plurality of smaller glass substrates can be loaded into a chamber (1120) or (1150) and coated simultaneously. In other embodiments, chamber assemblies for supporting larger or smaller rectangular substrates can be configured. A small chamber assembly may be configured to support a single GEN 1.0 (300×400 mm) substrate and a large chamber assembly may be configured to support a single GEN 7.0 (2160×2460 mm) substrate without deviating from the present invention.

The frame (1140) supports a plurality of subsystems associated with each of the two chambers (1120) and (1150). In particular, the system (1000) includes all of the subsystems required to operate each of the two chambers (1120) and (1150) independently and simultaneously. Accordingly, the upper gas deposition chamber (1120) includes an upper input gas supply system (1135) and the lower chamber (1150) includes a lower gas input supply system (1160). Each of the input gas supply systems (1135) and (1160) include reservoirs of precursor, inert purge, and other gases as may be required for gas deposition cycles. In addition, each of the input gas supply systems (1135) and (1160) includes a mass flow controller for delivering a volume of gas into the corresponding input plenum. Additionally, each gas supply system may include a heater and temperature sensors for delivering gases at desired temperatures.

Each gas deposition chamber (1120) and (1150) includes a front facing load port (1190) and (1170) with a load lock door disposed to move vertically downward to provide access to the respective chamber through its front facing load port and to move vertically upward to close the load port and vacuum seal the gas deposition chamber during substrate coating cycles. Each gas deposition chamber (1120) and (1150) includes an electronic controller (1165), only one shown, for controlling operations of the respective chamber, for logging data, and for processing operator input commands. In addition, both of the electronic controllers (1165) are preferably connected to a computer network in order to communicate with and exchange data and or operating commands with external devices as may be required. Generally each electronic controller (1165) includes a programmable microprocessor, one or more digital memory devices, a network interface, a user interface, a power distribution module and interfaces to each electrical subsystem used to operate the chamber. Each gas deposition chamber (1120) and (1150) further includes a vacuum pump and associated vacuum hardware, detailed below, for evacuating the respective chamber and processing gas outflow from the chamber. In addition, each gas deposition chamber (1120) and (1150) includes elements for heating and insulating the outer walls of the chamber and or monitoring conditions such as gas pressure, various temperatures, load lock door position, whether a substrate is loaded, safety and other conditions. In addition, the preferred dual chamber gas deposition system (1000) includes a vent (1100) located in the center of a top face for venting gas outflow from both chambers and lighting tower (1110) extending upward from the top face and including several different colored lighting elements that are used to display an operating status of the dual chambers (1120, 1150).

Figure 4:
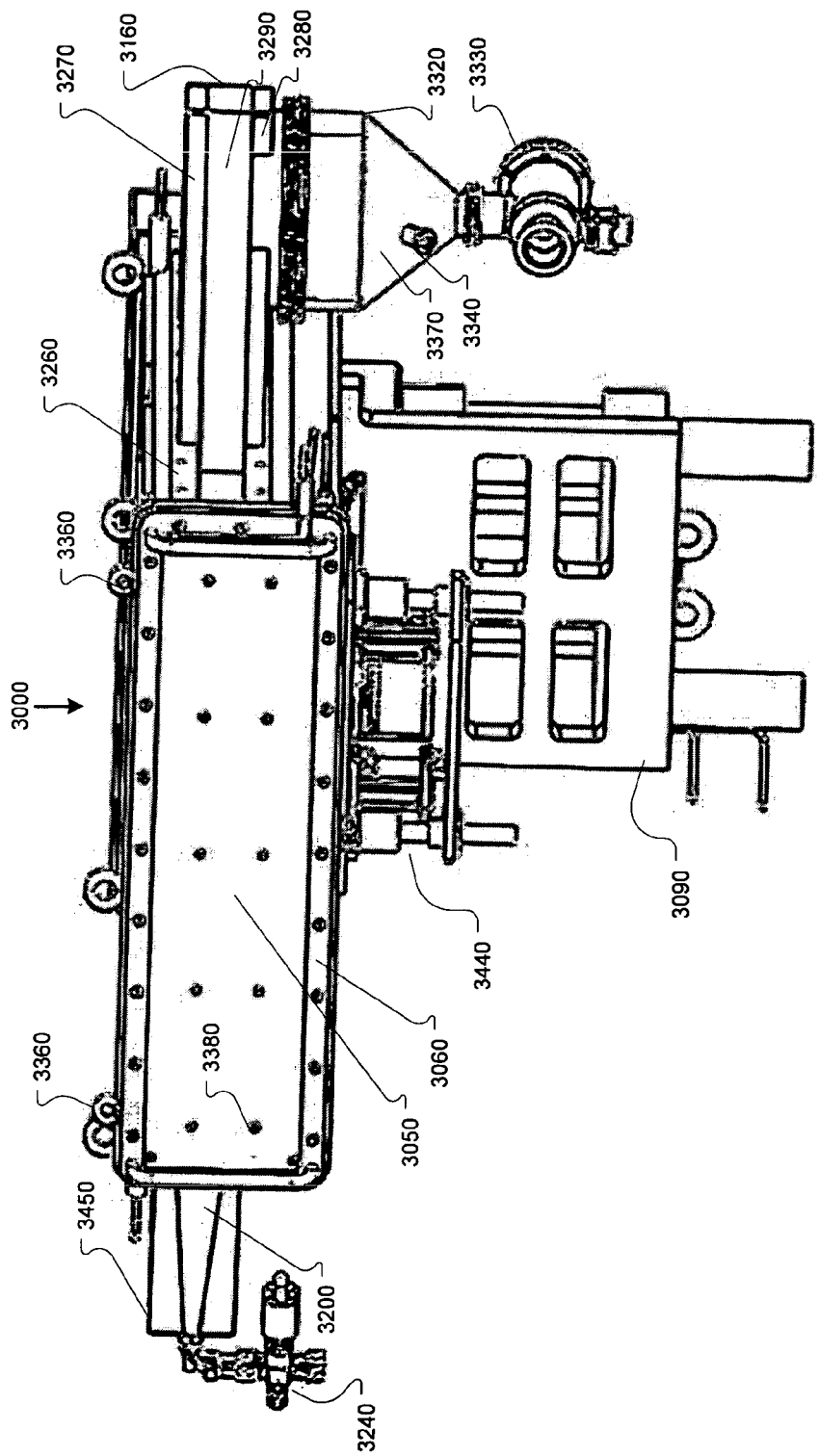
FIG. 4 depicts a back isometric back view of a gas deposition chamber assembly according to the invention.
Figure 10:
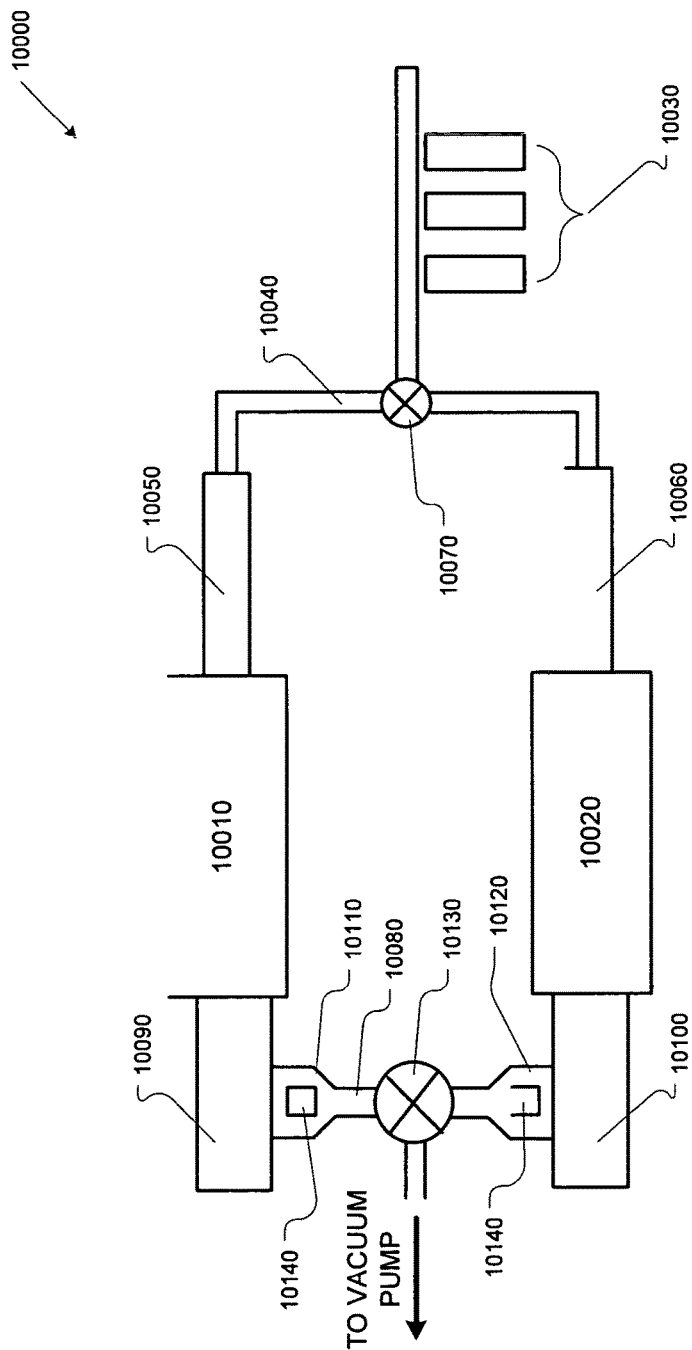
FIG. 10 depicts a front schematic view of dual chamber system having a gas supply module connected to both chambers and a vacuum pump connected to both chambers according to the present invention.

Referring to FIGS. 3, 4 and 10, by way of e.g., a gas supply module (3240, 10030) includes a plurality of gas sources with each gas source delivering a source gas into an input manifold (10035) or other suitable conduit. The source gases may include precursors, inert gases and other gaseous or vapor materials as may be useful for carrying out desired reactions with substrate surfaces and or purging or cleaning the reaction chamber. The gas source may comprise a gas, vapor, aerosol, compound, element, excited species, radical or the like.

A mass flow control valve (10045) is disposed between each gas source and the input manifold (10035) and is controlled by the electronic controller (1165 not shown). The electronic controller (1165) operates mass control valves (10045) according to preprogrammed sequences associated with various coating cycles. Each mass flow control valve (10045) may be closed to stop the flow gas from an associated gas source. Each mass flow control valve (10045) may be opened to provide a continuous flow of gas at a desired mass flow rate or each mass flow control valve (10045) may be pulsed to open for a desired time interval and then close for a desired time interval to deliver a pulsed flow of gas into the input manifold (10035) with each gas pulse having a precise volume or mass flow rate.

As is further shown in FIGS. 3, 4 and 10, the input manifold (10035) is in fluid communication with at least one input plenum (10050, 3150) either directly or over a fluid conduit (10040) such that gases contained in the input manifold pass into the input plenum (10050, 3150) through an input port (which delivers source gases into the input plenum through a gas input port e.g. (3230). Accordingly in the example embodiments of FIGS. 3, 4 and 10, the source gasses are delivered into the input plenum (10050, 3150) through a single input port (3230) and may be delivered one at a time or two or more source gasses may be flowing through the input port at once. As an example, during a coating cycle, an inert gas such as nitrogen may be continuously flowing through the input port (3230) and first and second precursor gases may be alternately pulsed through the input port (3230) mixing with the inert gas. In addition, the continuous flow of inert gas helps to purge each precursor from the reaction chamber between precursor pulses.

Figure 2:
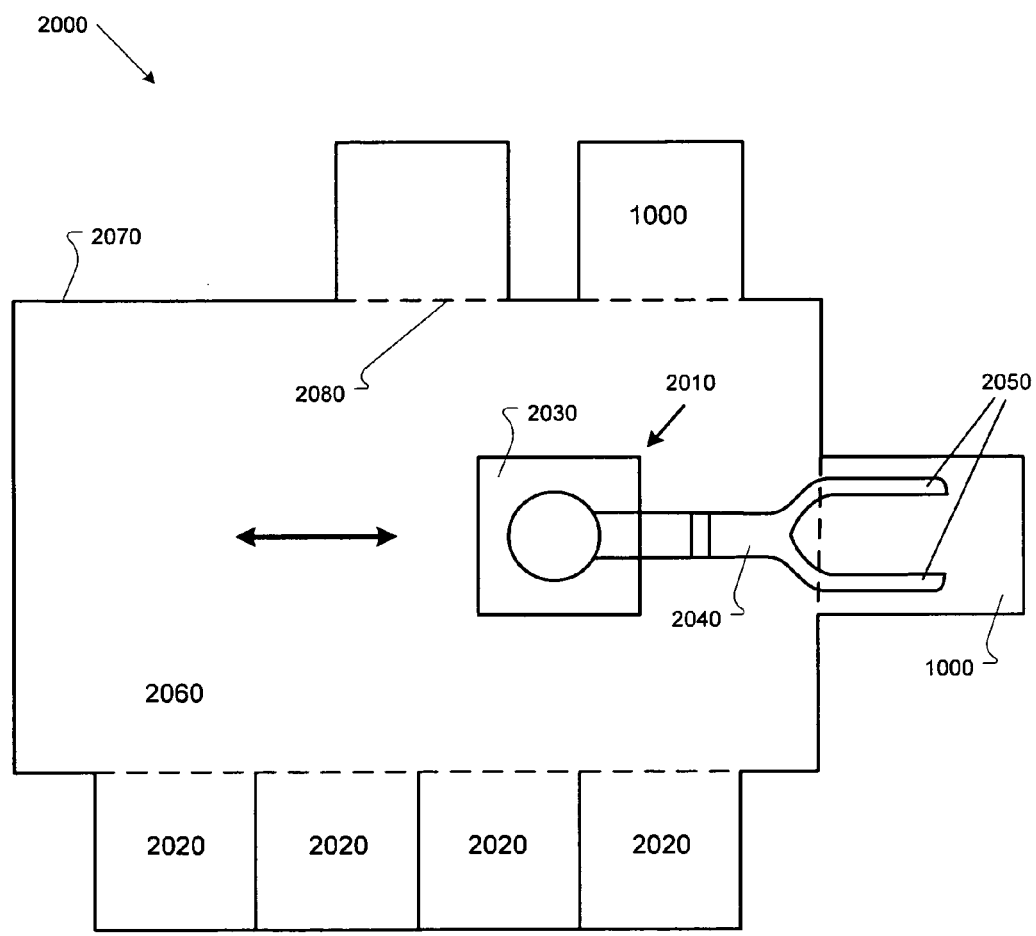
FIG. 2 depicts a plan view of an automated production facility that includes one or more dual chamber gas deposition systems of the present invention.

Automated Production Facility, Robotic Substrate Handler FIG. 2

Referring now to FIG. 2, an automated gas deposition production facility (2000) is shown in top view. The production facility (2000) comprises one or more of dual chamber gas deposition systems (1000) associated with one or more robotic substrate handlers (2010) and one or more substrate storage racks (2020). The robotic substrate handler (2010) includes a robotic base (2030) which is movable with respect to a floor or base surface, a manipulator arm (2040), which is movable with respect to the robotic base (2040), and a pair of substrate lifting elements, or the like (2050). The robotic substrate handler (2010) is housed within a clean room (2060) surrounded by wall panels (2070). Preferably, the dual chamber gas deposition system(s) (1000) and the substrate storage rack(s) (2020) are disposed external to the clean room (2060). The substrate storage rack(s)

(2020) each support a plurality of GEN 4.5 substrates disposed horizontally with a vertical separation between adjacent substrates. Each of the wall panels (2070) includes wall ports (2080) indicated by broken lines. A wall panel (2070) may include two or more walls ports (2080) disposed at various vertical heights one above another. In particular, each gas deposition system (1000) is positioned with its front face (1180) proximate to a wall panel (2070) and the wall panels associated with each system (1000) include two wall ports (2080) with one wall port being aligned to correspond with the top load lock port (1190) and the other wall port being aligned to correspond with the bottom load lock port (1170). Inn addition, wall ports (2080) are opposed to each of the substrate storage racks (2020).

The robotic substrate handler (2010) moves the robotic base (2030) and the manipulator arm (2040) to guide the lifting elements (2050) through various wall ports (2080) to either pick up or drop off a substrate in a desired area. For example, to pick up an uncoated substrate from a storage rack (2020) the lifting elements (2050) are extended into the storage rack just below a horizontally supported substrate and then raised to lift and support the substrate on the lifting elements (2050). The robotic substrate handler (2010) then withdraws the substrate from the storage rack (2020) and transports the substrate to a selected chamber of one of the dual chamber gas deposition systems (1000) for insertion into the selected chamber through one of the top or bottom load ports (1190) or (1170). The selected chamber may comprise whichever chamber is ready to receive a new substrate for coating, because each chamber of the dual chamber systems (1000) communicates with the robotic substrate handler (2010) to request loading or unloading of a substrate or to open or close the load lock as required for loading and unloading. Accordingly, in the preferred embodiment of the present invention, the dual chamber tower (1000) is configured for autonomous loading and unloading by a robotic substrate handler like the handler (2010) shown in FIG. 2.

Chamber Outer Walls, Eye Hooks, Heating Elements and Insulation FIG. 3

Referring now to FIGS. 3-8 and 16, a gas deposition chamber assembly (3000) is shown in various views with like elements having the same reference number. The chamber (3000) is shown in front isometric view in FIG. 3, in rear isometric view in FIG. 4 and in section view with the section A-A being shown in FIG. 5. As best viewed in the schematic view of FIGS. 5 and 5A, the chamber assembly (3000) comprises a plurality of outer walls formed by opposing top and bottom rectangular outer walls (3010) and (3020) attached to opposing left and right rectangular outer walls (3030) and (3040) and attached to opposing front and back outer walls (3042) and (3044) In one embodiment, each of the front and back outer walls (3042) and (3044) comprise a perimeter flange surrounding a rectangular aperture. A front rectangular aperture (3035) passes through the front outer wall (3010) and serves as a load port. A back rectangular aperture (3045), which is optional, passes through the back outer wall (3044) and serves as a second access port to the hollow rectangular chamber. If a back rectangular aperture is included, a removable back panel (3050) is attached to the back outer wall (3044) by a back perimeter flange (3060) for attaching and vacuum sealing the back panel (3050). In some embodiments the front and back wall may comprise front and back faces of the top, bottom and side walls with dimensions of the front and back apertures equal to the rectangular dimensions of the rectangular hollow chamber. The back panel may also attach to a removable cleanable chamber liner, described below. Accordingly, the back panel (3050) may also include eye bolts (3360), or the like suitable for supporting the back panel from above during installation. The top and bottom, left, right and back outer walls surround a hollow rectangular chamber (3070) which is open at a front face. The hollow chamber front face forms a rectangular port through which substrates can be inserted into the hollow rectangular chamber (3070). A movable access door (3080) is movably supported with respect to a support bracket (3090) which is fixedly attached to the bottom outer wall (3020). A pair of door actuators (3100) is disposed between the support bracket (3090) and the access door (3080) to guide and transport the movable access door along a vertical axis. In a down position the access door exposes the rectangular access port to provide access to the hollow chamber (3070). In an up position, the access door (3080) closes the rectangular access port and vacuum seals the substrate port during coating cycles.

The top and bottom outer walls (3010) and (3020) comprise thick aluminum walls which function as a heat sink to maintain a constant chamber temperature over many hundreds or thousands of gas deposition cycles. Electrical resistive heating elements (3110) are disposed in the top outer wall (3010) and may be included in the bottom outer wall (3020), the access door (3080) and the back panel (3050) for heating the hollow rectangular chamber (3070) and the outer walls to desired gas deposition temperatures (e.g. ranging from 85 to about 500° C.). The top and bottom outer walls (3010) and (3020) as well as the access door (3080) and the back panel (3050) may also include a thermal insulation layer (3120) disposed on external surfaces thereof or disposed as internal layers thereof for preventing thermal heat loss from the chamber assembly. The top outer wall (3010) includes a plurality of eye bolts (3125) suitable for lifting the chamber assembly (3000) into and out of the frame (1140) with an overhead hoist or the like.

Figure 5:
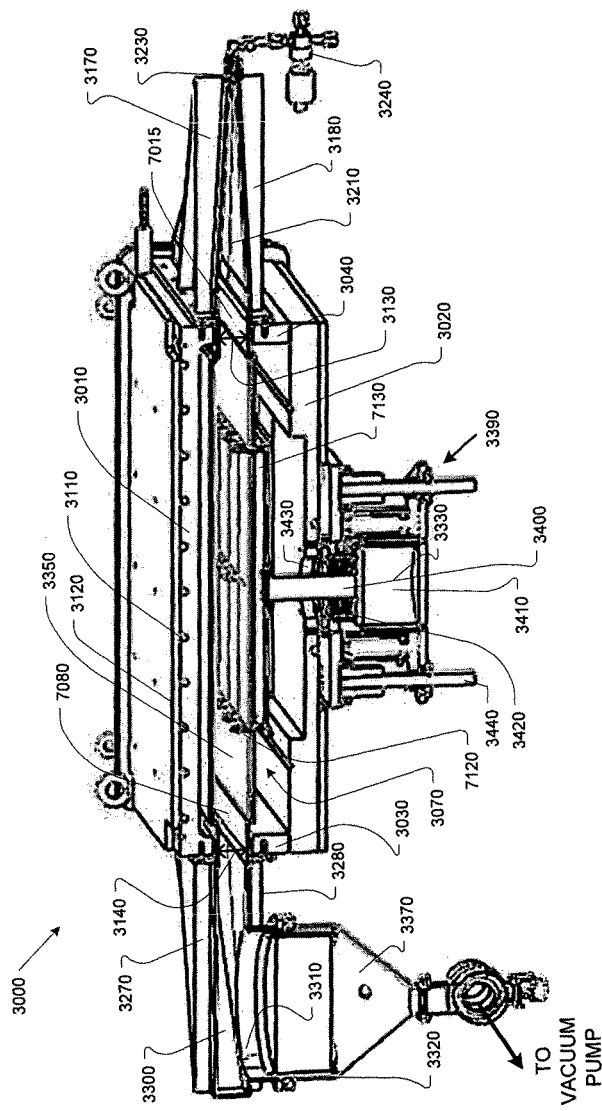
FIG. 5 depicts an isometric view of showing section A-A taken through a gas deposition chamber assembly according to the invention.
Figure 5A:
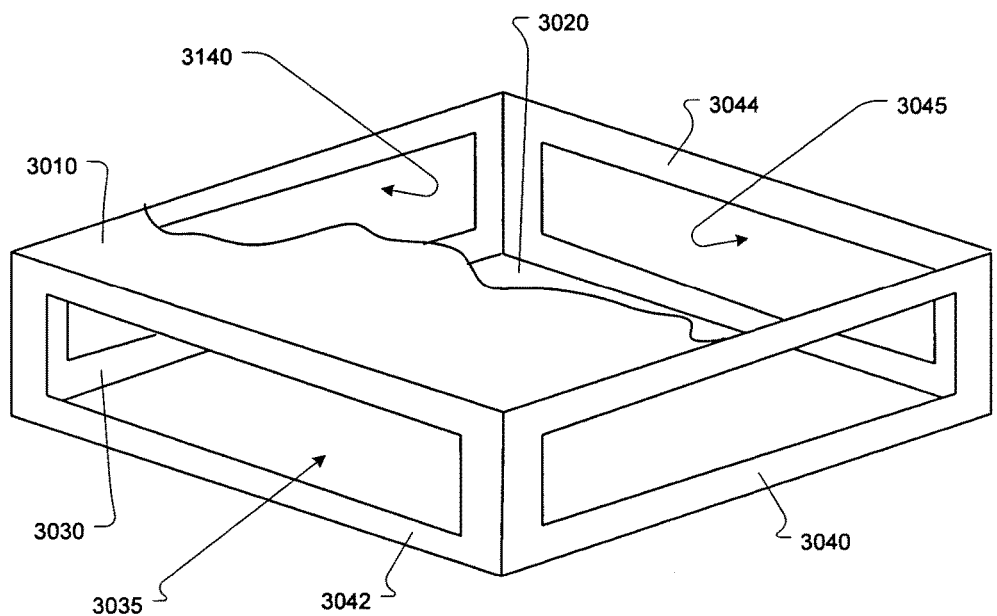

Referring to FIGS. 3, 4 and 5A the reaction chamber assembly (3000) has rectangular cross-section in a substantially horizontal X-Y plane with a longitudinal length extending along the y-axis and a transverse width extending along the x-axis with a triangular input plenum (3150) attached to the right outer wall (3040), a triangular output plenum attached to the left outer wall (3030) and an load port and associated access door disposed at a front wall of the reaction chamber assembly. In other embodiments, the longitudinal length may extend along the x-axis with the transverse width extending along the y-axis without deviating from the present invention. Additionally, the reaction chamber assembly has a height along a z-axis. Similarly, as shown in outer wall assembly of FIG. 5A the hollow volume has a rectangular cross-section in an X-Y plane with a longitudinal length extending along the y-axis and a transverse width extending along the x-axis and a height along the z-axis. In the present example, rectangular substrates are loaded into the hollow volume and supported therein on one or more horizontally disposed substrate support surfaces with a longitudinal length of the substrate extending along the y-axis and a transverse width of the substrate extending along the x-axis.

Input and Output Plenums FIGS. 3-5

Referring now to FIGS. 3 and 5, the right outer wall (3040) extends along the Y-axis and is formed with a right rectangular through aperture (3130) open to the hollow rectangular chamber (3070). The right rectangular through aperture is substantially centered in the right side wall its position and Y-axis dimension substantially corresponds with the Y-axis position and dimension of a substrate positioned inside the hollow rectangular chamber (3070) for coating. An input plenum (3150) is attached to the right outer wall (3040) by an input plenum flange (3160). The input plenum flange (3160) forms a vacuum seal with the right outer wall (3040). The bolt pattern and sealing elements of the input plenum flange (3160) and the right outer wall (3040) are modular to allow a user to reconfigure the chamber assembly (3000) with various input plenum configurations or to bolt other elements to the right side outer wall (3040) as may be required, including an output plenum to reverse the flow direction of the chamber assembly.

In the preferred embodiment the input plenum (3150) comprises opposing substantially triangular shaped top and bottom input plenum walls (3170) and (3180) attached to opposing substantially trapezoid shaped input plenum side walls (3190) and (3200). The triangular shaped top and bottom input plenum walls (3170) and (3180) combine to enclose a substantially triangular shaped first cross-section of the input plenum chamber (3210) in the X-Y plane. The trapezoid shaped input plenum side walls (3190) and (3200) combine to enclose a substantially trapezoid shaped second cross-section of the input plenum chamber in the Y-Z plane. Thus the input plenum chamber is formed with a base of the triangular first cross-section and trapezoid shaped second cross-section open to the hollow rectangular chamber (3070) through the right rectangular aperture (3130) and is further formed with an apex of the triangular shaped first cross-section and trapezoid shaped second cross-section opposed to the base. A short input plenum end wall (3220) attaches to each of the top and bottom input plenum walls (3170) and (3180) and the side input plenum walls (3190) and (3200) to truncate the apex. A gas input port (3230) passes through the input plenum end wall (3220) proximate to the apex and a gas supply module (3240) delivers gases through the input port (3230) into the input plenum chamber (3210).

As best viewed in the isometric views of FIGS. 3 and 4, the longitudinal length or Y-axis dimension of the input plenum chamber (3210) in the triangular first cross-section expands linearly from the input port (3230) or apex to the plenum flange (3160) or base. The height or Z-axis dimension of the trapezoid shaped second cross-section of the input plenum chamber (3210) also expands linearly from the input port (3230) or apex to the plenum flange (3160) or base. In addition, the base of the input plenum chamber forms a rectangular aperture with rectangular dimensions that are substantially matched with rectangular dimensions of the right rectangular aperture such that input gases are expanded in the input plenum chamber to substantially fill the right rectangular aperture before being delivered into the hollow volume or reaction chamber. Accordingly, gases delivered through the input port (3230) expand to substantially fill the volume of the input plenum chamber (3210) and this causes gas flowing through the input plenum chamber (3210) to expand to substantially fill the right rectangular through aperture (3130) while also reducing the gas pressure and velocity in proportion to distance from the input port (3230). Accordingly, the shape of the input plenum chamber (3210) helps to prevent turbulent gas flow and eddy currents from being generated inside the input plenum chamber (3210) and contributes to producing a substantially laminar gas flow through the right rectangular through aperture (3130) and, as will be described in detail below, over the top surface of a substrate being coated.

The left outer wall (3030) extends along the Y-axis opposed to the right outer wall (3040) and is formed with a left rectangular through aperture (3140) open to the hollow rectangular chamber (3070). The Y-axis dimension and position of the left rectangular through aperture (3140) are matched with the Y-axis position and dimension of the right rectangular through aperture (3130) and the Y-axis dimension of the left and right rectangular apertures match or exceed the Y-axis dimension of a substrate positioned inside the hollow rectangular chamber (3070) for coating. Accordingly, gas enters the hollow rectangular chamber (3070) through the right rectangular aperture (3130), flows horizontally over the top surface of a substrate supported inside the hollow rectangular chamber (3070) for coating and exits the hollow rectangular chamber (3070) through the left rectangular aperture (3140). An output plenum (3250) is attached to the left outer wall (3030) by an output plenum flange (3260). The output plenum flange (3260) forms a vacuum seal with the left outer wall (3030). The bolt pattern and sealing elements of the output plenum flange (3260) and the left outer wall (3030) are modular and matched to the bolt pattern of the input plenum (3150) and right side wall (3040) to allow a user to reconfigure the chamber assembly (3000) with various output plenum configurations, as may be required, or to bolt other elements to the left side outer wall (3030) as may be required, including an input plenum as required to reverse the flow direction of the chamber assembly.

In the preferred embodiment the output plenum (3150) comprises opposing substantially triangular shaped top and bottom output plenum walls (3270) and (3280), attached to opposing substantially rectangular output plenum side walls (3290), only one is shown. The triangular shaped top and bottom output plenum walls (3270) and (3280) combine to enclose a substantially triangular shaped first cross-section of the output plenum chamber (3300) in the X-Y plane. The trapezoid shaped output plenum side walls (3290), only one shown, combine to enclose a substantially trapezoid shaped second cross-section of the output plenum chamber in the Y-Z plane. Thus the output plenum chamber is formed with a base of the triangular first cross-section and trapezoid shaped second cross-section open to the hollow rectangular chamber (3070) through the left rectangular aperture (3140) and is further formed with an apex of the triangular shaped first cross-section and trapezoid shaped second cross-section opposed to the base. A short end wall, not shown, attaches to each of the top and bottom walls (3270) and (3280) and the opposing rectangular side walls (3290), the other not shown, to truncate the apex of the triangular shaped output plenum chamber (3300). An exit port (3310) passes through the bottom output plenum wall (3280) and an exit port module (3320) attached to the exit port (3310) is in fluid communication with a vacuum pump, not shown. Alternately, the exit port (3310) can be formed in the top output plenum wall (3270).

The exit port module (3320) includes a cone shaped passage (3370) terminated by a stop valve (3330) for closing the cone shaped passage (3370) to isolate the exit port module from the vacuum pump. A vacuum pressure gauge (3340) is disposed in the cone shaped passage (3370) for sensing gas pressure in the exit port module (3320). The vacuum pump, not shown, is operated to draw gas through the exit port module (3320) to evacuate the chamber assembly (3000) by pumping gas out of the chamber assembly (3000). As best viewed in the section view of FIG. 5, the width of the triangular shaped output plenum chamber (3300) is narrower at the exit port (3310) than it is at the output plenum flange (3260) and the triangular shape of the output plenum chamber (3300) causes the velocity of gas flowing there through to increase as it approaches the exit port (3310). The increase in gas velocity proximate to the exit port decreases the cycle time required to purge or evacuate the hollow rectangular chamber (3070).

Each of the input and output plenums (3150) and (3250) include structural stiffening ribs (3450) disposed and welded on the top and bottom plenum walls (3170, 3180, 3270, 3280) to prevent the top and bottom plenum walls from buckling under the substantial pressure gradient between the vacuum pressure inside each plenum and atmospheric external pressure. In addition, each of the input and output plenums (3150) and (3250) comprises walls fabricated from metals that are cleanable by an acid etch or the like (e.g. stainless steel). Accordingly both of the plenums are removable in order to remove built up ALD coatings from internal surfaces of the plenums by an acid etch or the like. Moreover internal surfaces of the plenums may be roughened (e.g. by shot or bead blasting) to improve coating adhesion to the plenum internal surfaces and thereby prevent cracking or flaking of ALD layers between cleaning cycles. The roughened internal surfaces extend the time that the plenums can be used without cleaning. Accordingly, each of the input and output plenums (3150) and (3250) can be removed for cleaning or swapped with an auxiliary set of clean plenums to avoid production down time. In addition, external surfaces of each of the input and output plenums (3150) and (3250) may be thermally insulated to prevent thermal losses through the plenum walls and the external surfaces may be heated by electrical heating coils disposed thereon. In addition each plenum may include various sensors for sensing temperature, pressure, gas type, and other conditions inside or proximate to the plenums. In addition, each plenum may include internal baffles, not shown, e.g. disposed on or between internal surfaces of the top and bottom plenum walls (3170, 3180, 3270, and 3280) to direct gas flow along desired flow paths inside the plenum.

Gas Flow FIG. 5

Referring now to the section AA shown in FIG. 5, a substantially horizontally disposed gas flow path extends from the input port (3230) through the triangular input plenum chamber (3210), through right rectangular aperture (3130), through the hollow rectangular chamber (3070) over the top surface of a substrate positioned inside the chamber assembly, through the left rectangular aperture (3140) and through the triangular output plenum chamber (3300), to the exit port (3310). The combined volume of the input and output plenums and the entire hollow rectangular chamber (3070) comprises a vacuum gas deposition chamber. Accordingly, any joints or seams of the outer chamber walls are welded and any flanges, ports or other apertures passing through the outer chamber walls are configured with seals and bolt patterns that are suitable for deep vacuum operation. In particular, the outer walls, the input and output plenums, the movable access door (3080), the back panel (3050) and any ports that passes through any of these elements is constructed for substantially leak proof operation in deep vacuum and preferably the vacuum chamber can be pumped down to vacuum pressures of less than about 10 microtorr. In addition, the gas supply module (3240) includes a controllable stop valve for closing the input port (3230) and the exit port stop valve (3330) is controllable for closing the exit port (3310) as required by various gas deposition cycles. Accordingly the vacuum chamber can be isolated and maintained at a vacuum pressure for an extended period as may be required. In addition, the gas supply module and the vacuum pump can be operated continuously to pass a constant gas flow through the vacuum chamber, such as to purge the chamber with an inert purge gas such as nitrogen. Otherwise the gas supply module may operate non-continuously to deliver a precise volume of a desired gas, such as a precursor gas, into the chamber.

In operation, the combined volume of the input and output plenums and the entire hollow rectangular chamber (3070) are pumped to a vacuum pressure e.g. 10 microtorr. Thereafter, a small mass flow rate of inert purge gas is delivered into the reaction chamber while the vacuum pump continues to operate such that a steady state operating pressure of the reaction chamber is less than 1.0 torr and generally between 0.3 and 0.6 torr during gas deposition cycles. Moreover, the electronic controller is set to prevent the mass control valves (10045) from operating when the reaction chamber pressure is above 1.0 torr to prevent supply gasses from being delivered into the reaction chamber when the access door or other port is opened to atmosphere or before the reaction chamber is pumped down to a desired operating pressure.

Figure 6:
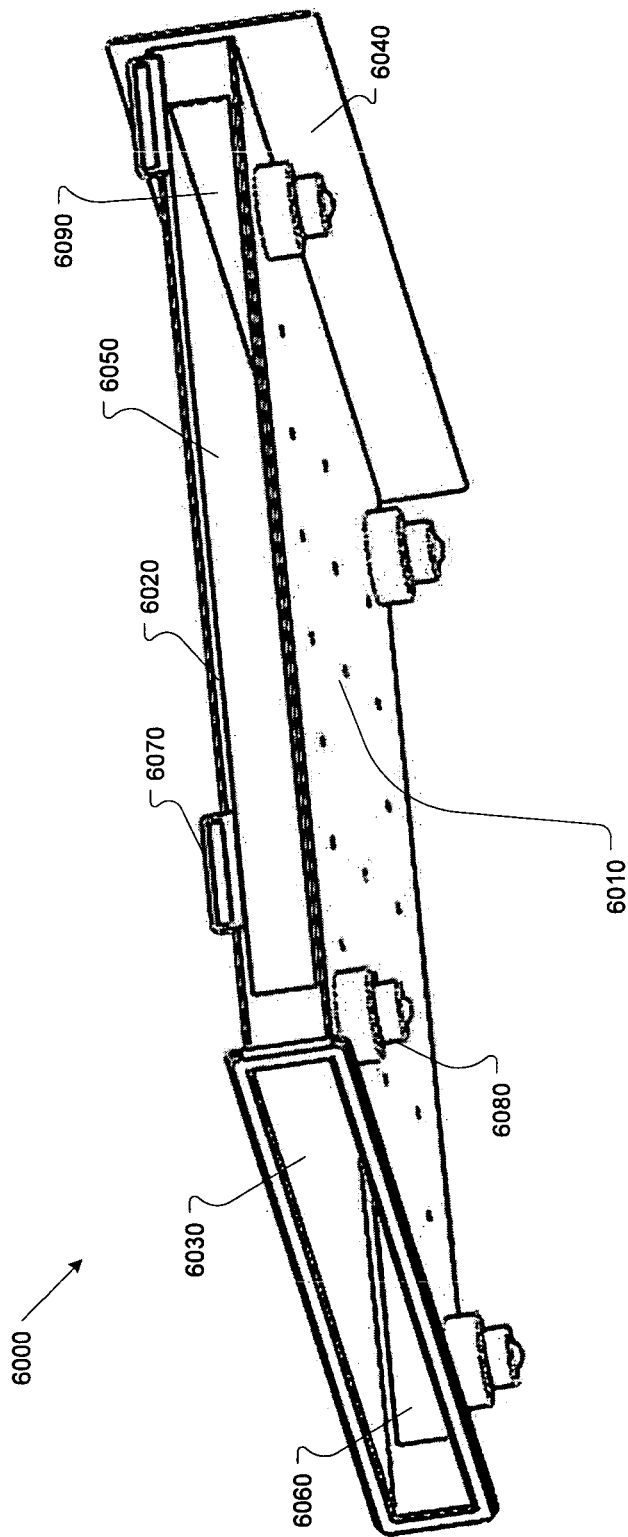
FIG. 6 depicts an isometric view of a welded chamber liner assembly according to the present invention.

Removable Liner FIGS. 4-6

Referring now to FIGS. 4 and 6, a removable cleanable liner assembly (6000) is shown in isometric view. The liner assembly (6000) installs into the chamber assembly (3000) through the back outside wall when the back panel (3050) is removed. The back panel (3050) and the liner assembly (6000) may be assembled together using the fasteners (3380) and installed into the chamber assembly as a unit. The liner assembly (6000) includes a substrate support surface for supporting a substrate being coated. The liner assembly (6000) further forms portions of an inner chamber that substantially prevents precursor gas from contaminating internal surfaces of the chamber outer walls to prevent ALD coating layers from forming on non-cleanable aluminum surfaces.

The liner assembly includes a liner base wall (6010) and an opposing liner top wall (6020). A top surface of the liner base wall (6010) functions as the substrate support surface (3350) shown in FIG. 5. A liner front wall forms a front rectangular aperture (6030) that serves as a substrate load aperture at the front face of the chamber assembly. A liner back wall (6040) attaches to the back panel (3050) with fasteners (3380) and includes a rectangular back aperture (6090). An inside surface of the back panel (3050) opposed to the rectangular back aperture (6090) may comprise stainless steel in order to be cleanable, or the liner back wall (6040) may comprise a solid wall to protect the back panel (3050) from precursor contamination. The back panel (3050) is attached to the chamber outer back wall by the back perimeter flange (3060). The liner assembly (6000) includes opposing side walls that each includes a side rectangular through aperture (6050) and (6060) and these side rectangular through apertures align with the left and chamber right rectangular apertures (3130) and (3140) when the liner assembly (6000) is installed inside the chamber assembly (3000). All of the liner assembly walls comprise stainless steel which is cleanable by an acid etch or the like to removed built up ALD layers from the liner walls. The liner assembly (6000) can be swapped with an auxiliary liner assembly when it is contaminated to allow production to continue while the contaminated liner is cleaned.

Because the liner assembly weighs about 120 pounds, lifting handles (6070) are provided on the liner top wall (6020) to allow the liner assembly to be supported from an over head crane or a lifting tool by straps or hooks. Similarly the back panel eye bolts (3060) can be supported by a lifting device while the liner assembly is guided into the chamber assembly. Four tooling balls (6080), or the like, are mounted on the liner base wall (6010). The tooling balls (6080) contact with and roll along the bottom outer wall (3020) as the liner assembly is guided into the chamber assembly (3000) through the rear outer wall. The height or Z-axis dimension of the tooling balls (6080) establishes the Z-axis position of the substrate support surface (3350) to align the substrate support surface with the left and right rectangular apertures (3130) and (3140) and to position the top surface of a substrate being coated at a desired Z-axis height with respect to gas flow in the chamber.

Figure 7:
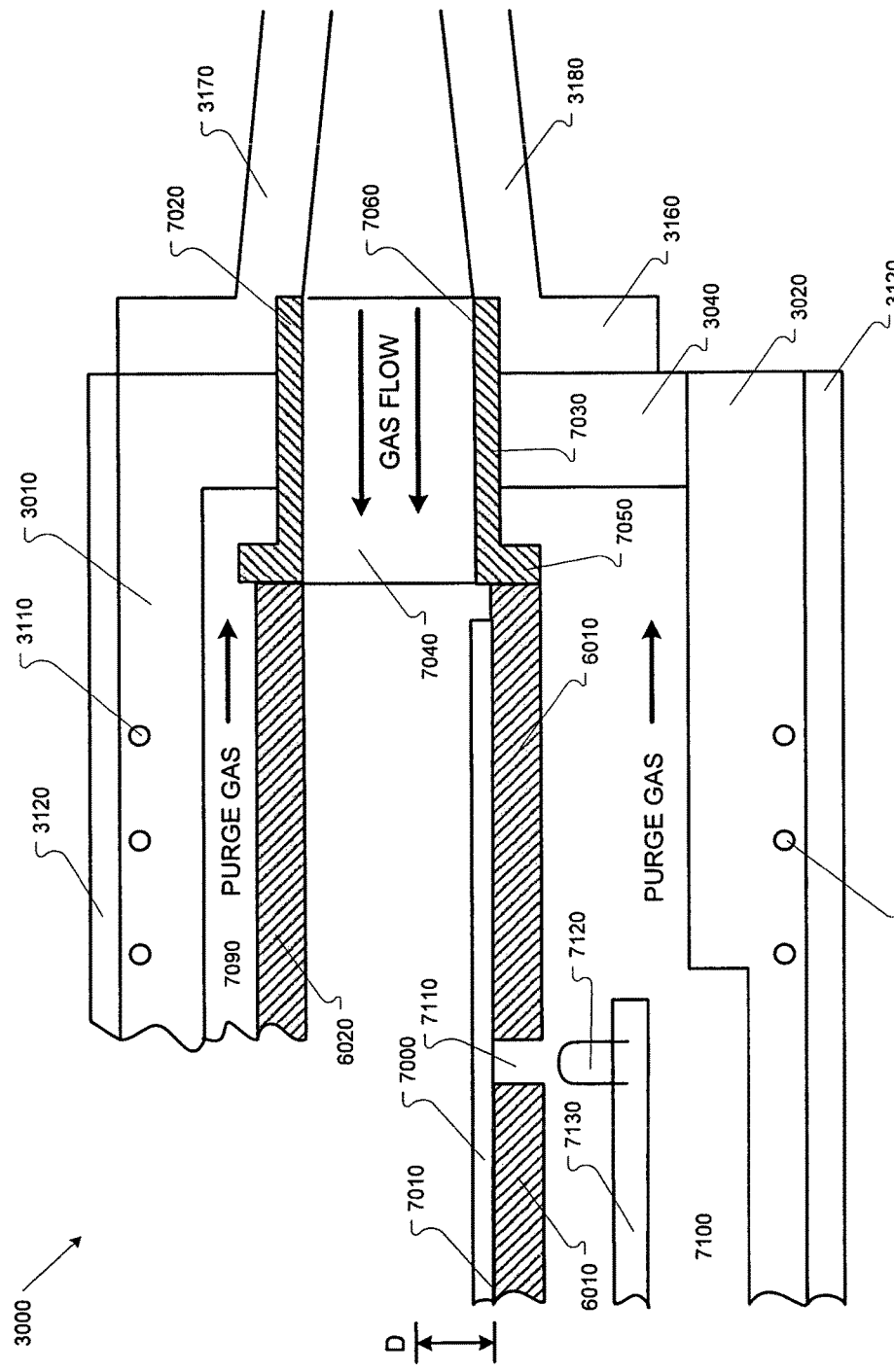
FIG. 7 depicts schematic representation of an exploded section view showing a substrate supported on the chamber liner assembly and a pair of plenum liners according to the present invention.

Plenum Liners Substrate Position, Purge Gas, Lift Pin FIG. 7

Referring now to FIG. 7, an exploded section view of the right side of chamber assembly (3000) shows the top and bottom input plenum walls (3170) and (3180) and the input plenum flange (3160), the top and bottom chamber outer walls (3010) and (3020) and the electrical heaters (3110) disposed therein and the thermal insulation layers (3120) disposed thereon, the chamber right outer wall (3040) and the right rectangular aperture (3130) passing there through. The bottom and top plenum liner walls (6010) and (6020) are inside the hollow rectangular chamber (3070) and the bottom liner wall (6010) is shown positioned to support a substrate (7000) on a substrate support surface (7010).

As is further shown in FIGS. 5 and 7, an input plenum liner (7015) comprises a rectangular tube shaped element formed by opposing top and bottom plenum liner walls (7020) and (7030) as well as a back plenum liner wall (7040) and an opposing front plenum liner wall, not shown. The input plenum liner installs through the right rectangular aperture (3130) from inside the hollow rectangular chamber (3070) and includes a flange (7050) formed to butt up against the internal surface of the chamber right outer wall (3040). The flange (7050) is formed on four sides of the input plenum liner for surrounding the entire right rectangular aperture (3130). The flange (7050) locates the input plenum liner and prevents precursor gas from contaminating the chamber right outer wall (3040). The flange (7050) also butts tightly up against the right side wall of the removable liner assembly (6000). A top surface (7060) of the bottom plenum liner wall (7030) is disposed substantially coplanar with of the top surface of the substrate (7000). Gas exiting from the input plenum flows through the input plenum liner and over the substrate (7000). By positioning the input plenum liner top surface (7060) coplanar with the stop surface of the substrate (7000) eddy current formation at the leading edge of the substrate (7000) is avoided. An output plenum liner (7080), shown in FIG. 5, is substantially identical to the input plenum liner described above and installs through the left rectangular aperture (3140).

As best viewed in FIG. 7 the hollow rectangular chamber (3070) is not completely filled by the liner assembly (6000) and an upper volume (7090) and a lower volume (7100) extends between the liner top and bottom walls (6020) and (6010). The volumes (7090) and (7100) may also be fluidly connected with each other at the front and rear of the hollow rectangular chamber (3070). In addition, the lower volume (7100) is used to house a movable pin assembly, described below, and the lower volume (7100) is in fluid communication with the inside of the liner assembly (6000) through pin holes (7110) that pass through the bottom liner wall (6010). To further prevent precursor gas from contaminating internal surfaces of the other walls, one or both of the upper and lower volumes (7090) and (7100) is substantially continuously purged with nitrogen or an inert gas. The purge gas is pumped into the upper and lower volumes (7090) and (7100) at a low positive pressure (e.g. less than about 5 pounds per square inch) such that the pressure of the purge gas prevents lower pressure precursor gas from entering the upper and lower volumes (7090) and (7100).

Figure 8:
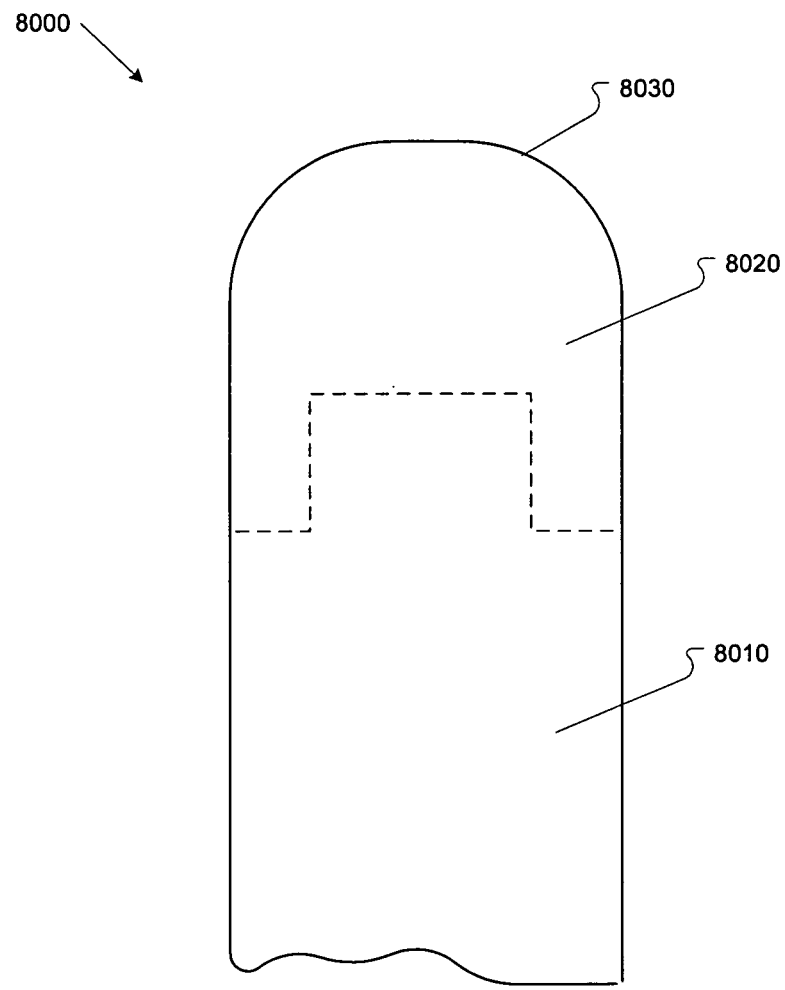
FIG. 8 depicts a side view of the top of a lift pin according to the present invention.

Movable Pin Assembly FIGS. 5, 7 and 8

Referring now to FIGS. 5 and 7 a plurality of lift pins (7120) are movably supported by a movable pin plate (7130) disposed in the lower volume (7100) between the bottom outer wall (3020) and the bottom liner wall (6010). The pin plate (7130) is a rectangular plate and the plurality of lift pins (7120) are arranged in rows and columns with each lift pin fixedly attached to the pin plate (7130) and with the top of each lift pin extending to an equal height above the movable pin plate such that the top of each lift pin (7120) forms one point of a substrate support surface. The bottom liner wall (6010) includes a plurality of through holes (7110) passing there through with one through hole (7110) corresponding with each of the plurality of lift pins (7120). When the movable pin plate (7130) is raised to a lift position, the plurality of lift pins (7120) extend through the plurality of corresponding through holes (7110) to either lift the substrate (7000) away from the substrate support surface (7110) or to position the pin tops at a height (D) above the substrate support surface (7010) for receiving a substrate (7100) on the pin tops. In particular, the height (D) corresponds to a height that allows the robotic substrate handler lifting arms (2050), shown in FIG. 2, to be inserted into the chamber assembly between the pin tops and the substrate support surface (7010) to load a substrate (7000) onto the pin tops or to unload a substrate from the pin tops. When the movable pin plate (7130) is lowered, the pin tops are lowered below the substrate support surface (7010) such that a substrate supported on the pin tops is placed in contact with the substrate support surface (7010). Preferably the lift pins (7120) remain engaged with the through holes (7110) when the pins are lower to limit the flow of purge gas through the holes (7110) however the pins can be lowered to a position below the bottom liner wall (6010) as shown in FIG. 7.

Referring now to FIG. 8, an exemplary embodiment of a lift pin (8000) is shown in cutaway side view. The exemplary lift pin (8000) comprises a cylindrical metal shaft (8010) and a tip attachment (8020). The tip attachment comprises VESPEL®, a polymer made by DuPont, or another suitable polymer, and is attached to the metal shaft (8010) by bonding or other suitable fastening means. Ideally the tip attachment (8020) material is can withstand the temperature range and harsh chemical environment of the gas deposition chamber without damage while also providing low out gassing and high thermal and electrical insulation. The top end of the tip attachment (8020) is formed with a spherical end (8030).

Referring now to FIG. 5, a pin actuator assembly (3390) is disposed outside the chamber assembly attached to an external surface of the bottom outer wall (3020). A lift post (3400) extends between a pneumatic cylinder and piston assembly (3410) and the movable pin plate (7130) by passing through a circular hole (3430) through the chamber bottom outer wall (3020) a vacuum bellows (3420). The vacuum bellows (3420) extends from the pneumatic cylinder and piston assembly (3410) to the chamber bottom outer wall and vacuum seals the circular through hole (3430). The pin actuator assembly (3390) further includes a pair of guide rods (3440) for guiding movement of the pneumatic cylinder and piston assembly (3410) and the lift post (3400). The system controller coordinates actuation of the pin actuator assembly to raise and lower the movable pin plate when the access door is open for the loading and unloading of substrates.

Referring to FIGS. 5 and 7, according to the present invention, a substrate to be coated is installed into the hollow rectangular chamber (3070) by lowering the movable access door (3080) and raising the movable pin plate (7130). A substrate (7000) is then inserted into the chamber by the robotic substrate handler (2010) or another insertion device and set down resting on the tops of the plurality of lift pins (7120). One dimension of the substrate (7000) is substantially centered between the input and output plenums (3150) and 0250 and the other dimension of the substrate is centered with respect to the left and right rectangular apertures (3130) and (3140). The movable pin plate (7130) is then lowered to set the substrate (7000) onto the substrate support surface (7110) and the access door (3080) is closed and vacuum sealed. The chamber is then heated to raise the substrate to the gas deposition temperature and the vacuum pump is started to pump the chamber down to a vacuum pressure. The chamber may also be purged with an inert gas during the initial pump down to remove contaminants such as water vapor. When the chamber is at the desired vacuum pressure and the substrate at the desired temperature, a gas deposition recipe can begin. Generally, the recipe begins by closing the stop valve (3330) and introducing a precursor gas into the chamber through the input port (3230). Alternately, the precursor can be introduced with the stop valve (3330) open and the vacuum pump operating. After the first precursor cycle, the chamber is purged by running the vacuum pump and flushing the chamber with a purge gas. The cycle is then repeated for a second precursor gas and the two precursor gas cycle may be repeated many thousands of times. When substrate coating is complete, the stop valve (3330) is closed and the chamber is purged to atmosphere through the input port or another port. The movable access door (3080) is opened and the movable pin plate (7130) is raised to lift the coated substrate from the substrate support surface. The robotic substrate handler (2010) then removes the coated substrate form the chamber and installs an uncoated substrate into the chamber for the next coating cycle.

Figure 9:
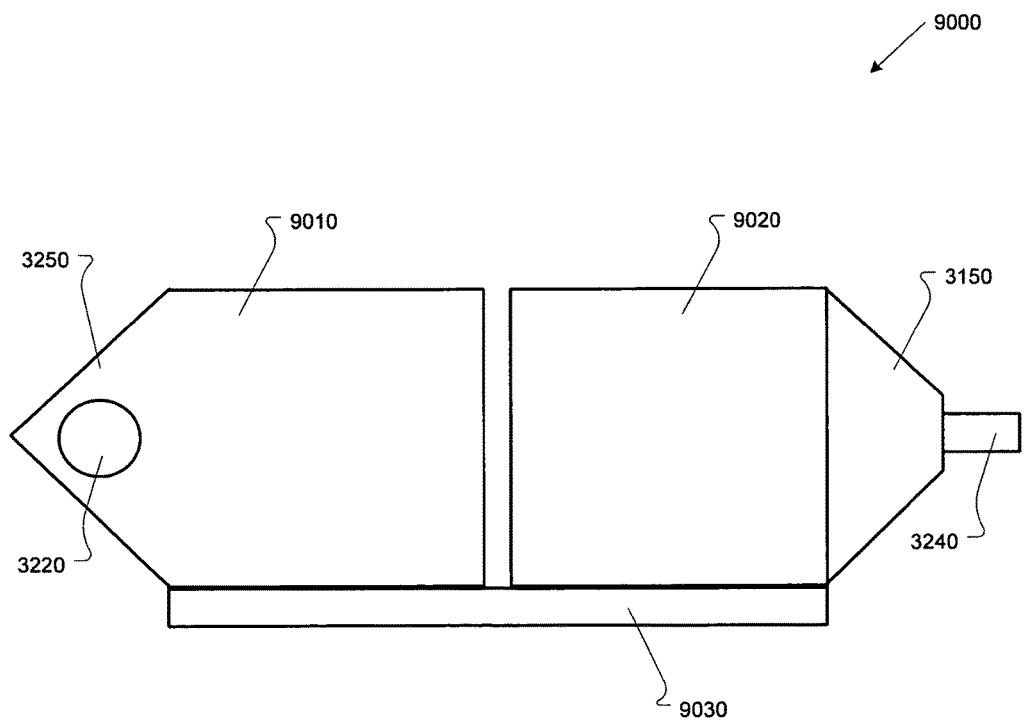
FIG. 9 depicts a top schematic view of a double wide gas deposition chamber according to the present invention.
Figure 11:
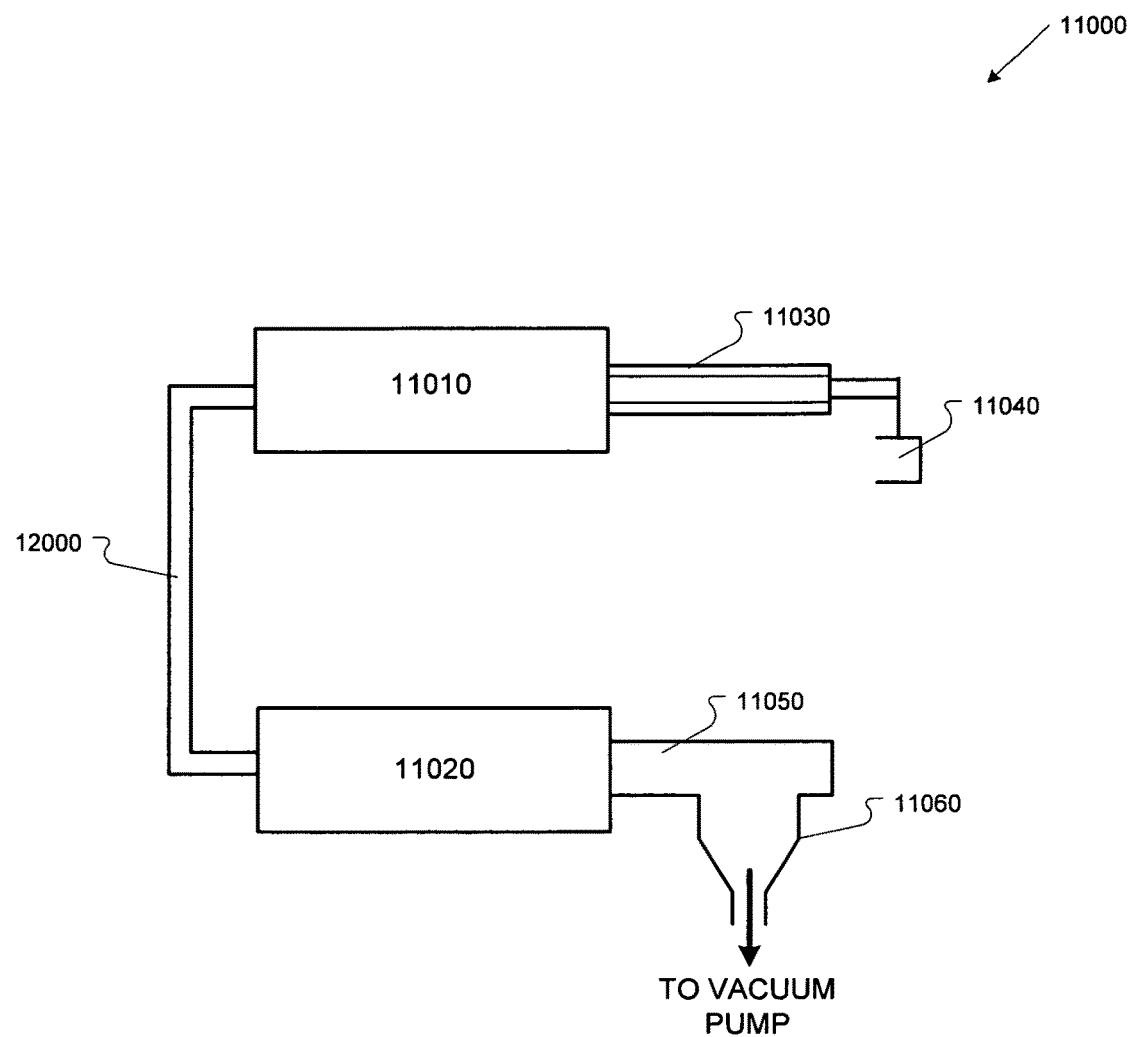
FIG. 11 depicts a front schematic view of a dual chamber system with an input plenum associated with one chamber an output plenum associated with the outer chamber and a rectangular conduit connecting the two chambers together in series according to the present invention.

Referring now to FIGS. 9-11 additional embodiments of the present invention relate to systems and methods for coating two or more substrates in a single chamber assembly, as is shown in FIG. 9, or for driving two or more coating chamber assemblies with a single gas supply module and vacuum pump. In particular, FIG. 9 depicts a top schematic view of double wide chamber assembly (9000) configured to receive two rectangular glass substrates (9010) and (9020) disposed side by side on a horizontal support surface and with a double wide movable door (9030) supported for vertical movement to provide access through a front face of the chamber assembly to insert the two rectangular glass substrates (9010) and (9020). Otherwise the chamber assembly (9000) is substantially identical with the chamber assembly (3000) described above. In particular the chamber assembly (9000) utilizes the same input plenum (3150) disposed between one of the left and right plenum apertures and a gas supply module (3240) for delivering gas and vapor phase materials into the outer volume through the corresponding left or right plenum aperture supply module (3240) and the same output plenum (3250) and exit port module (3220) described above. Accordingly, the input plenum delivers a substantially laminar gas flow across the horizontal top surfaces of both of the rectangular glass substrates (9010) and (9020) before gas is removed from the double wide chamber through the exit port module (3220). In addition, a system controller used to control coating sequences in the chamber assembly (9000) may include coating recipes that are adjusted to deliver additional precursor gas volume into the double wide chamber as may be required to ensure that both substrates are uniformly coated.

Referring now to FIGS. 10 and 11, two additional embodiments of the present invention are shown schematically. In FIG. 10 a dual chamber system (10000) includes two chamber assemblies (10010) and (10020) that are each substantially identical to the chamber assembly (3000) described above except that the two chamber assemblies (10010) and (10020) share a common gas supply module (10030) and a common vacuum pump, not shown. Moreover, the two chamber assemblies (10010) and (10020) may be mounted in the frame (1140), described above and shown in FIG. 1, such that the system (10000) can replace a dual tower system (1000) in the automated production facility (2000) described above and shown in FIG. 2.

Each of the chamber assemblies (10010) and (10020) includes a shared input conduit (10040) that delivers input gases to a top input plenum (10050) and a bottom input plenum (10060). A first stop valve (10070) disposed in the input conduit can be operated to close the input conduit (10040) to both input plenums (10050) and (10060), to open the input conduit (10040) to both input plenums (10050) and (10060) such that input gas is delivered to both input plenums simultaneously, or to open the input conduit (10040) to one of the two input plenums (10050) and (10060) such that input gas is delivered to only one input plenum.

In addition, each of the chamber assemblies (10010) and (10020) includes a shared output conduit (10080) that is in fluid communication with the vacuum pump to remove gas from a top output plenum (10090) and a bottom output plenum (10100) through a top exit port module (10110) and a bottom exit port module (10120). In addition, each exit port module (10110) and (10120) includes a precursor trap (10140) disposed therein to remove precursor gasses from the chamber outflow.

A second stop valve (10130) disposed in the output conduit (10080) can be operated to close the output conduit (10080) to both output plenums (10090) and (10100), to open the output conduit (10080) to both output plenums (10090) and (10100) such that gas is removed from both output plenums simultaneously, or to open the output conduit (10080) to one of the two output plenums (10090) and (10100) such that gas is removed from only one output plenum. Accordingly in a first operating mode, the dual chamber system (10000) can be controlled to perform the same coating cycle simultaneously in each of the two chambers (10010) and (10020) by opening the first stop valve (10070) to deliver input gas to both chambers simultaneously and opening the second stop valve (10110) to remove gas form both chambers simultaneously. Except that the volume of input gas is increased to feed two chambers, and that sensors in both chambers are monitored to ensure that the chamber conditions are suitable for coating, the dual chamber system (10000) can be operated as if it were performing a single coating cycle while actually coating two substrates.

In a second operating mode, the dual chamber system (10000) can be operated to completely coat one substrate in a selected chamber (e.g. while the unselected chamber is unloaded and then reloaded). In the second operating mode, both the first and second stop valves (10070) and (10130) are set to direct gas flow to and from the selected chamber and the system (10000) performs all of the coating cycles required to completely coat the substrate loaded into the selected chamber.

In a third operating mode, the dual chamber system (10000) can be operated in a multiplex mode wherein a substrate to be coated is loaded into both chambers (10010)

and (10020) and heated to the desired coating temperature. In this operating mode, the first and second stop valves (10070) and (10130) are set to perform a first coating cycle, (e.g. to coat one mono-layer), in the top chamber (10010) with the stop valves positioned to prevent gas flow to and from the bottom chamber (10020). Thereafter both stop valves are set to perform the same first coating cycle on the substrate in the bottom chamber (10020) and the process is completed until both substrates are completely coated as required.

Referring now to FIG. 11, a dual chamber system (11000) includes two chamber assemblies (11010) and (11020) that are each substantially similar to the chamber assembly (3000) described above except that the two chambers are connected together in series. The two chamber assemblies (11010) and (11020) may be supported by the frame (1140) described above and shown in FIG. 1 In particular, the upper chamber (11010) includes an input plenum (11030) and a gas supply module (11040) like the input plenum (3150) and gas supply module (3240) described above. The gas supply module (11040) and input plenum (11030) operate to deliver input gas into the upper chamber (11010) through its right rectangular aperture (3130), shown in FIG. 5. The lower chamber (11020) includes an output plenum (11050) and exit port module (11060) disposed on the right side thereof vertically opposed to the input plenum (11030) and the output the exit port module (11040) is in fluid communication with a vacuum pump, not shown.

Figure 12:
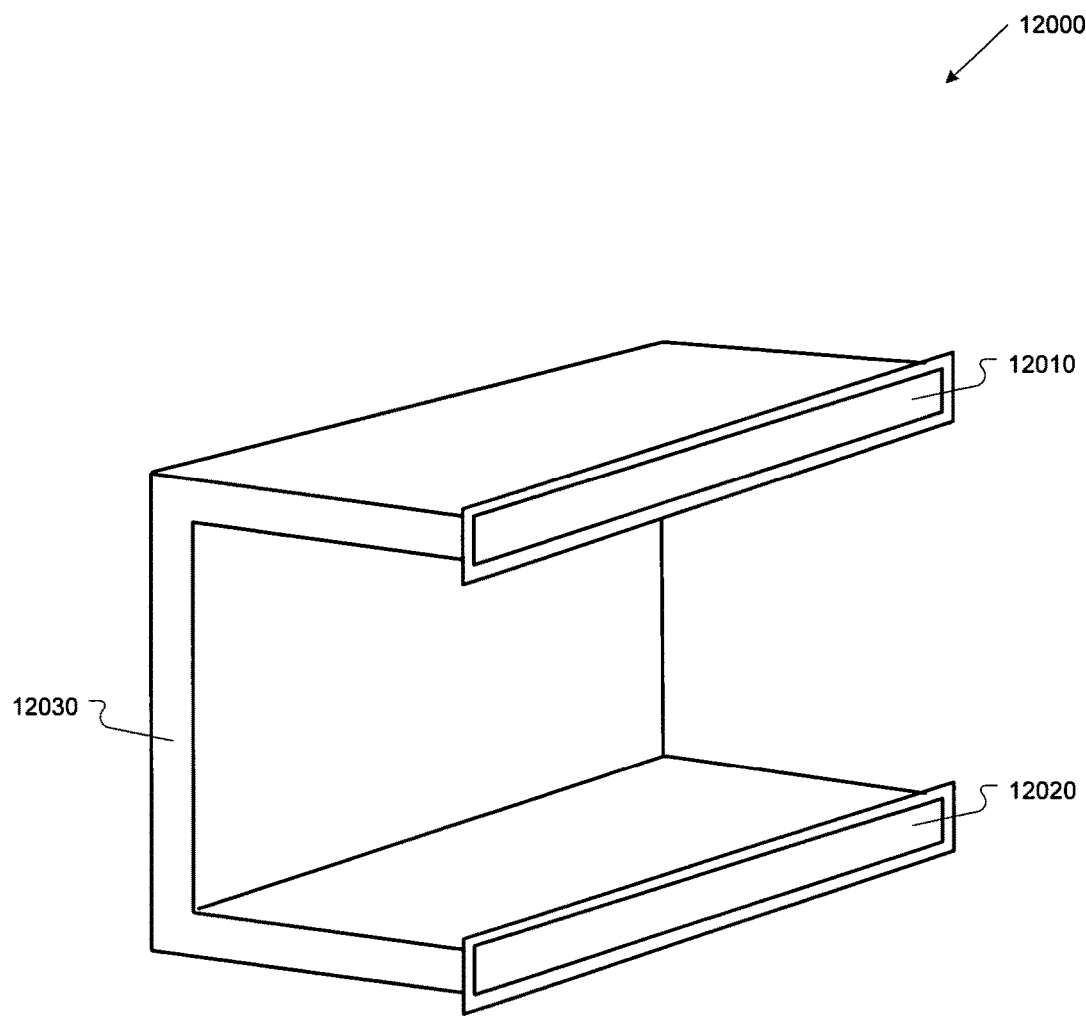
FIG. 12 depicts an isometric view of a rectangular fluid conduit according to the present invention.

The dual chamber system (11000) includes a rectangular conduit (12000) shown in isometric view in FIG. 12. The rectangular conduit (12000) includes an upper flange and associated rectangular input port (12010), a lower flange and associated rectangular output port (12020) and a rectangular fluid conduit (12030) that fluidly connects the rectangular input port and the rectangular output ports. The upper and lower flanges are configured like the output plenum flange (3260), described above and shown in FIG. 4. The rectangular conduit (12000) is disposed with its upper flange attached to the left side of the upper chamber (11010) and its lower flange attached to the left side of the lower chamber (11020) and both flanges form a vacuum seal with the corresponding chamber.

The width of the rectangular conduit input port and output ports (12010) and (12020) and the width of the rectangular fluid conduit (12030) are substantially constant and substantially match the width of the chamber left rectangular apertures (3140), shown in FIG. 5. Accordingly gas flowing out of the upper chamber (11010) through the left rectangular aperture (3140) continues through the rectangular conduit (12000) substantially without changing its velocity or pressure to thereby limit the introduction of turbulence or eddy currents into the gas flow dynamics. Similarly gas flowing out from the rectangular conduit (12000) and into the lower chamber (11020) continues through the lower chamber substantially without changing its velocity or pressure to thereby limit the introduction of turbulence or eddy currents in the gas flow dynamics such that a substantially laminar gas flow passes over a second substrate installed in the lower chamber (11020). In operation, the dual chamber system (11000) utilized a single vacuum port to evacuate two chambers and a single gas supply module to deliver input gas into two chambers such that two substrates are coated by a single ALD coating cycle.

Figure 13:
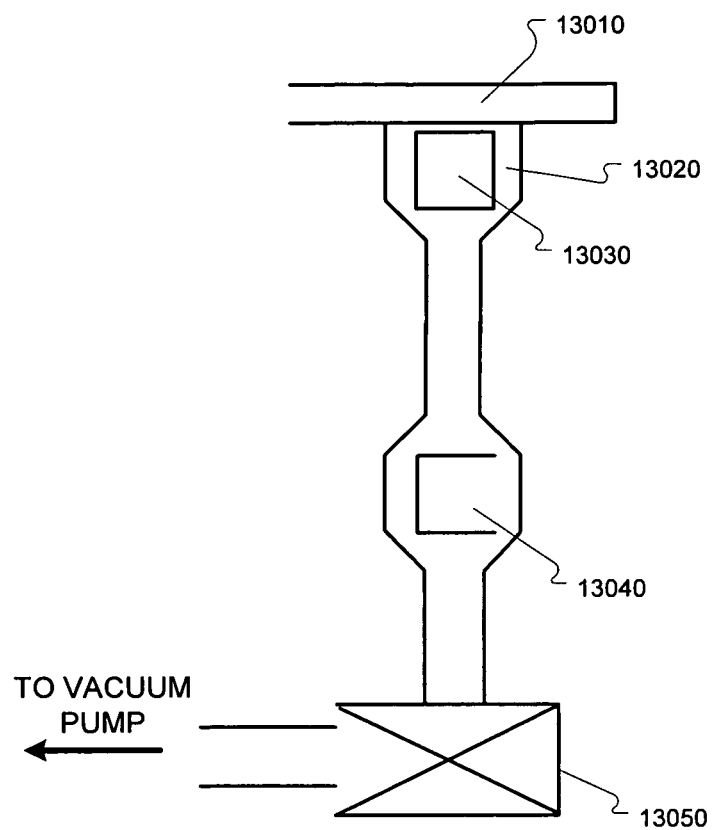
FIG. 13 depicts first and second traps disposed in series between an output plenum and a vacuum pump wherein a stop valve is positioned between the second trap and the vacuum pump according to the present invention.
Figure 14:
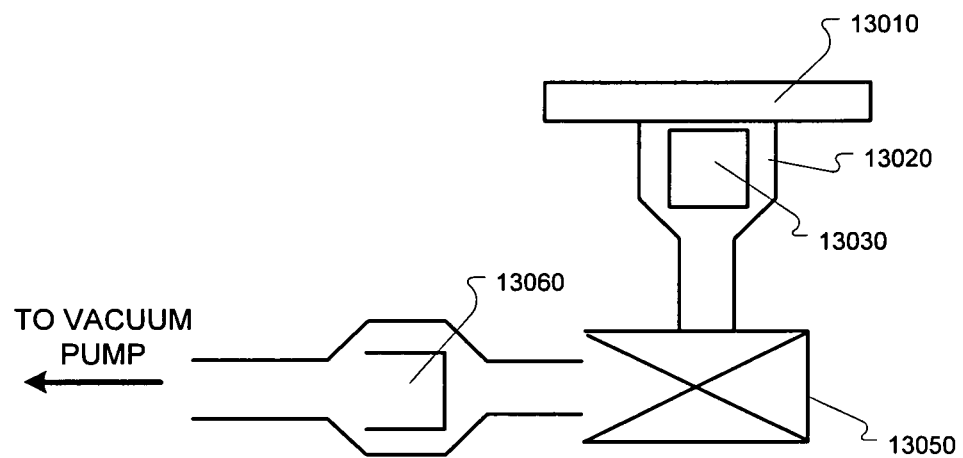
FIG. 14 depicts first and second traps disposed in series between an output plenum and a vacuum pump wherein a stop valve is positioned between the first and the second trap according to the present invention
Figure 15:
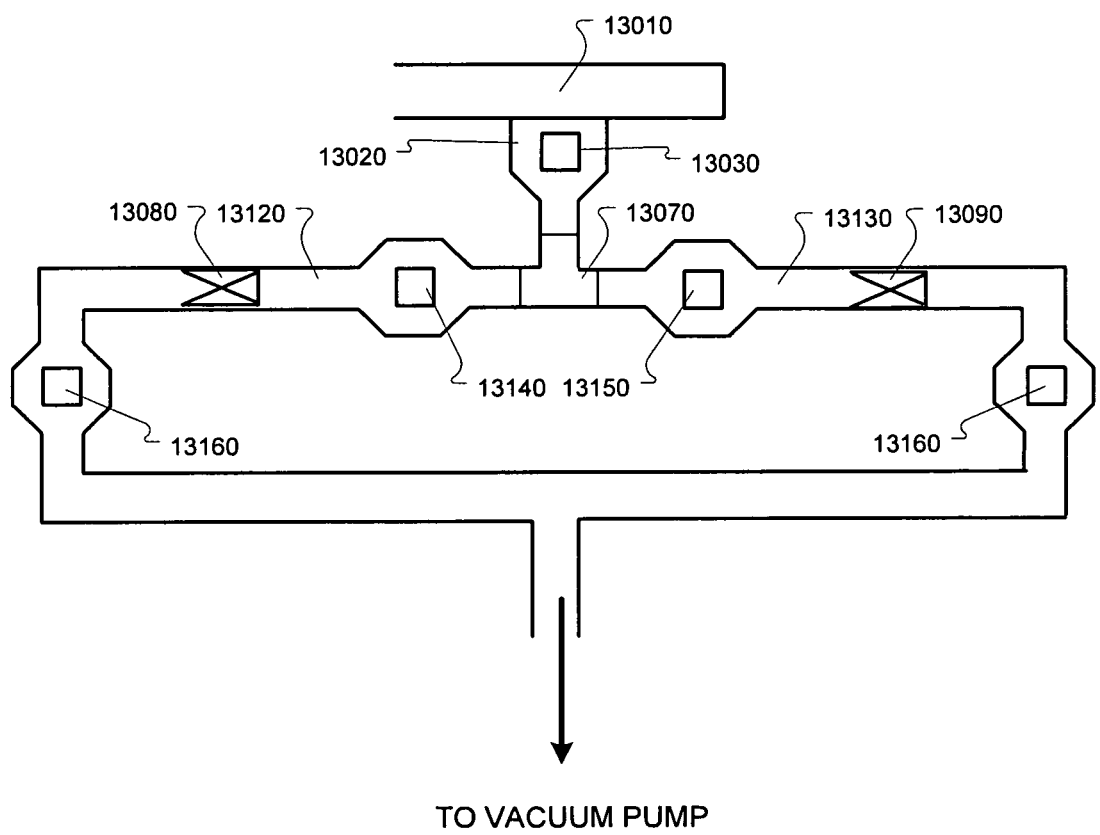
FIG. 15 depicts first second trap disposed in parallel fluid conduits extending from an output plenum and a vacuum pump wherein each parallel fluid conduit includes a stop valve and one or more additional traps according to the present invention.

Referring now to FIGS. 13-15 any one of the chamber assemblies (3000), (9000), (10000), (11000) may be configured with one or more traps disposed either in series or in parallel between the chamber assembly exit module and the system vacuum pump. In each of FIGS. 13-15 an output plenum (13010) is shown with an exit module (13020) extending out therefrom and gas outflow from the chamber assembly passes from the output plenum (13010) to the exit module (13020) through an exit port in a bottom wall of the of the output plenum (13010). In each example, a first precursor trap (13030) is disposed inside the exit module (13020) such that the gas outflow passes through the precursor trap (13030). Generally the first precursor trap (13030) comprises a high surface area matrix with the surface area being suitable for reacting with the precursor gas until the entire volume of unreacted precursor gas in the gas outflow is absorbed and decomposed by reaction with the surface area matrix. Preferably the first trap is heated to a reaction temperature suitable for the precursor gases being used for substrate coating. Accordingly the gas outflow exiting the first precursor trap (13030) will not contaminate contacting surfaces as it is delivered out of the system and vented.

Referring now to FIG. 13, a second trap (13040) is disposed in series with the first precursor trap (13030) and a stop valve (13050) is disposed between the second trap (13040) and the vacuum pump. In this example the second trap may comprise an auxiliary precursor trap (13040) which is also heated. The auxiliary precursor trap (13040) is substantially identical to the first precursor trap (13030) and serves as a back up to the first precursor trap (13030) should the surface area of the first precursor trap become ineffective or less effective for trapping precursor. In this example the auxiliary precursor trap (13040) is disposed between the first precursor trap (13030) and the stop valve (13050) to ensure that even if the first precursor trap (13030) becomes ineffective the stop valve (13050) and the vacuum pump are protected from precursor contamination. Moreover the auxiliary precursor trap (13040) can substantially double the number of coating cycles that a system can complete before the precursor traps need to be replaced.

Referring now to FIG. 14, a second trap (13060) is disposed in series with the first precursor trap (13030) and a stop valve (13050) is disposed between the first precursor trap (13030) and the second trap (13060). In this embodiment the second trap (13060) comprises a hydrocarbon trap that may include a catalytically active hydrocarbon (HC) oxidation matrix suitable for reacting with undesirable hydrocarbon gases in the gas outflow (e.g. to oxidize the hydrocarbons to carbon dioxide). In one example the second trap (13060) comprises a high surface area matrix with the surface area coated with ceria doped zirconia (Ce—$ZrO_2$) which absorbs oxygen from one ALD coating step (e.g. when the precursor comprises water vapor, oxygen, ozone or another oxygen containing component), and then serves as a suitable absorption site for hydrocarbon components of a second ALD coating step that generates hydrocarbon components. More generally the second trap (13060) includes catalytically active sites as may be provided by precious metal coatings such as platinum, palladium, rhodium, ruthenium, silver, or gold. Similarly the catalytically active sites may comprise a main group metal such as magnesium, iron, cobalt, nickel or the like, or acidic sites or any other sites that are capable of combining with gas phase or physically absorbed hydrocarbons to oxidize the hydrocarbons to carbon dioxide. Referring again to FIG. 13, the second trap (13060) may also comprise a hydrocarbon trap.

Referring now to FIG. 15 a plurality of traps are disposed in parallel between the first precursor trap (13030) and the vacuum pump. In this embodiment the exit module (13020) is connected to a T-fitting (13070) that divides the flow path into a left conduit (13120) and a right conduit (13130) which are both in fluid communication with the vacuum pump. A stop valve (13080) is disposed in a left conduit (13120) and a stop valve (13090) is disposed in a right conduit (13120) and the stop valves may be opened or closed as required to direct the gas flow to the left conduit (13120), the right conduit (13130), or both. Auxiliary precursor traps (13140) and (13150) are disposed in the left and right conduits between the first precursor trap (13030) and a corresponding stop valve (13080) or (13090) to provide additional precursor trapping capacity. A pair of third traps (13160) is disposed in the left and right conduits between a corresponding stop valve (13080) or (13090) and the vacuum pump. The third traps (13160) may comprise hydrocarbon traps as described above. All of the traps shown in FIG. 15 may be heated. All of the traps are installed into a chamber that allows trap replacement when the trap is no longer effective. Each trap may also be associated with a sensor or the like for determining the effectiveness of the trap so that gas flow can be redirected to the other parallel path to take advantage of a more effective trap set. Accordingly, the trapping configuration of FIG. 15 may be used to considerably extend the number of coating cycles that a gas deposition coating system can complete before the traps need to be replaced.

Figure 16A:
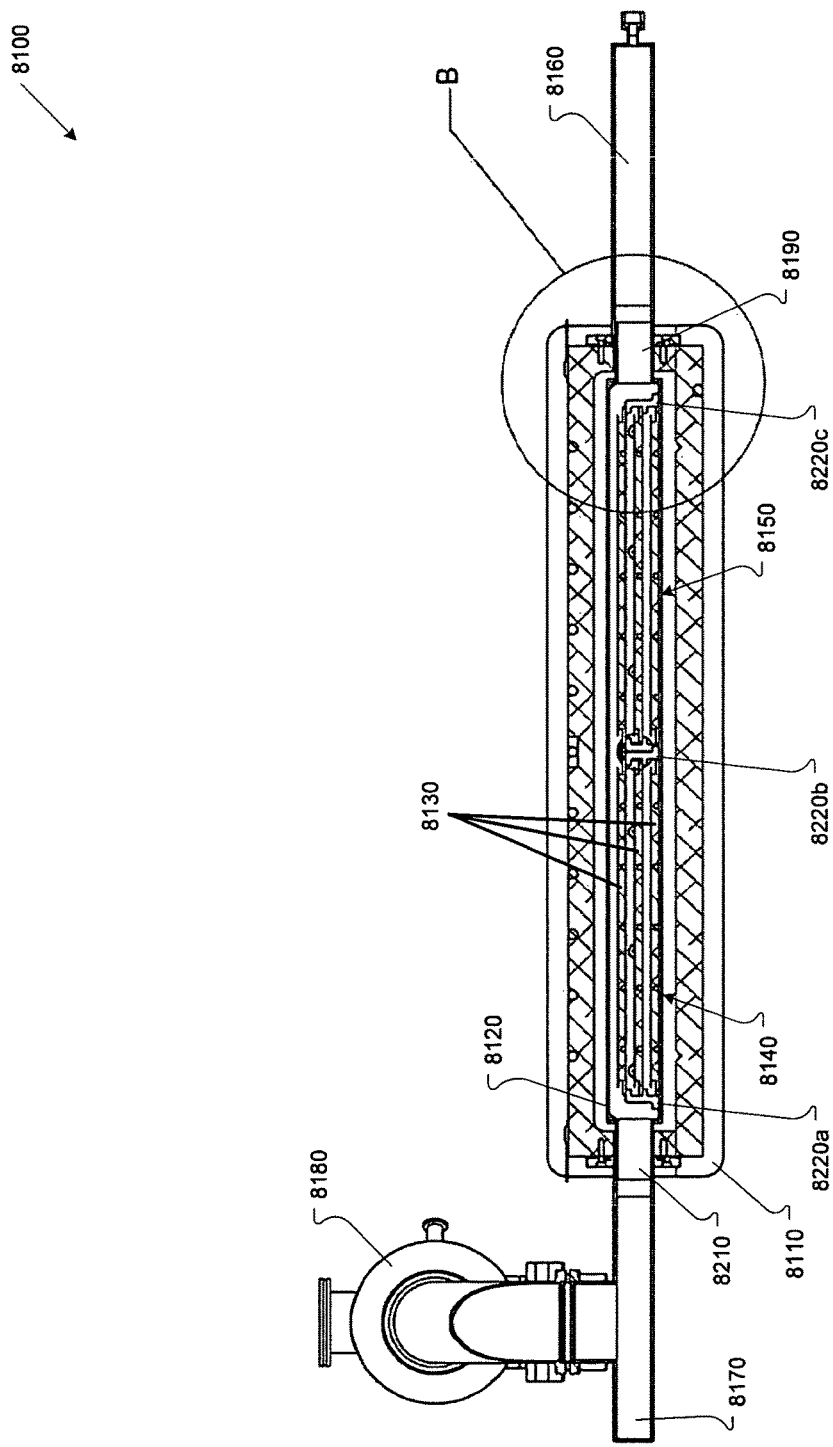
FIG. 16A depicts a section view of a gas deposition chamber that includes a plurality of substrate support shelves disposed between opposing input and output plenums.
Figure 16B:
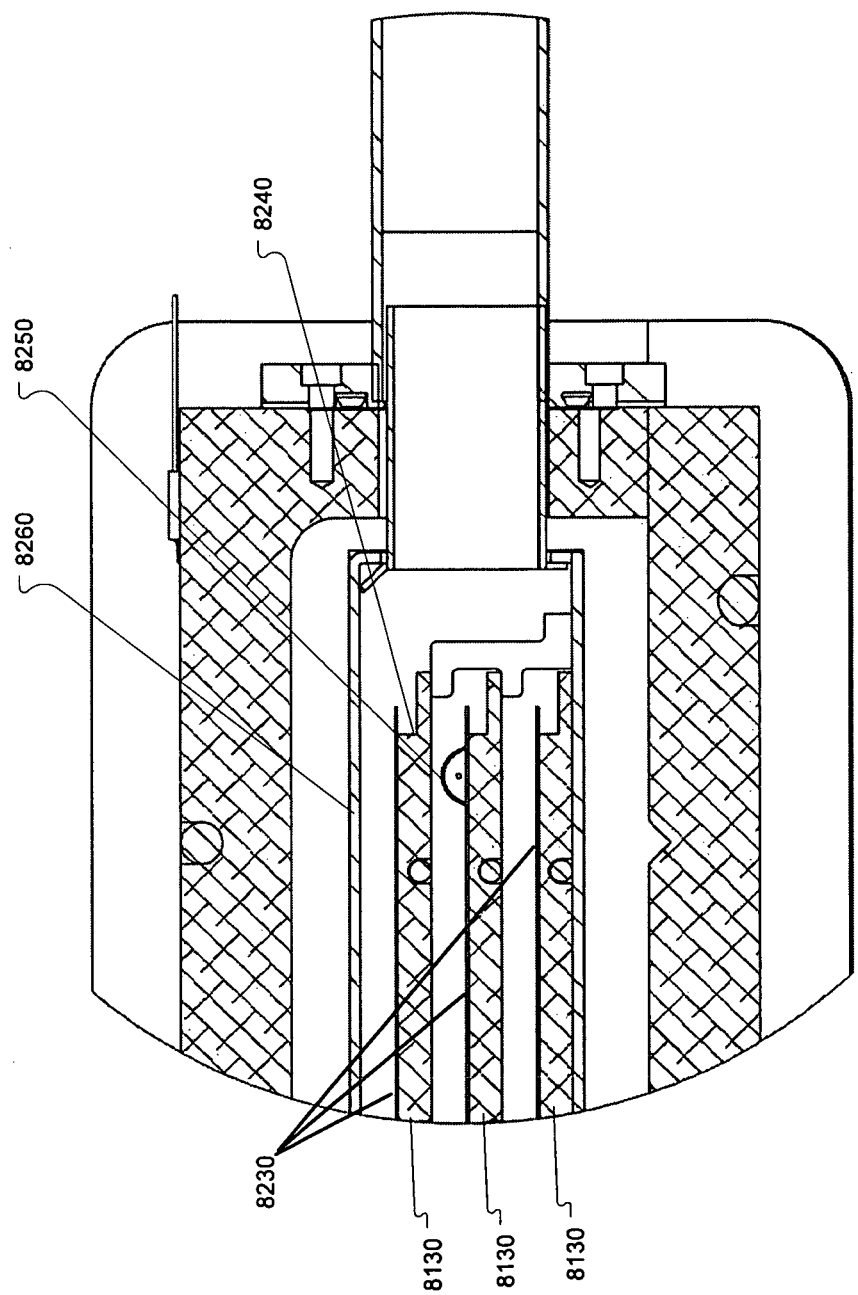
FIG. 16B depicts an enlarged section view of a portion of the gas deposition chamber that includes a plurality of substrate support shelves shown in FIG. 16A.

Referring now to FIGS. 16A and 16B another embodiment of a reaction chamber assembly (8100) according to the present invention includes an outer wall assembly (8110) enclosing a hollow rectangular chamber (8120) sized to support six substrate support shelves (8130) disposed horizontally therein. As shown in FIG. 16A a left support area (8140) include three horizontally supported substrate shelves stacked one above another and a right support area (8150) that includes an additional three horizontally supported substrate shelves stacked one above another. The reaction chamber assembly (8100) further includes an input plenum (8160), an output plenum (8170) and an exit port module (8180) all similar in design and function to above described modules of the same name. A front face, not shown, of the reaction chamber assembly (8100) includes a front rectangular aperture and associated movable access door, similar in design and function to above described modules of the same name, to provide access to the hollow rectangular chamber (8120) to load and unload one or more substrates onto each of the six substrate support shelves (8130).

Preferably, each of the six substrate support shelves (8130) is rectangular, is substantially identical, and is sized to receive a single rectangular substrate thereon ranging in size from GEN 1.0 (300×400 mm) to GEN 7 (2160×2460 mm) with the shelves configured to support the substrate short dimension or transverse width along the x-axis with the substrate long dimension or longitudinal length supported along the y-axis.

As with the reaction chamber assemblies described above, a right rectangular aperture (8190) extends along the entire longitudinal length or y-axis dimension of each substrate support shelf (8130) and receives input gas or vapor from the input plenum (8160) along the entire substrate longitudinal length. The input gas or vapor flows horizontally over the top of each of the six substrate support shelves (8130) and over the top surface of each of the substrates supported thereby. A right rectangular aperture (8210) extends along the entire longitudinal length or y-axis dimension of each substrate support shelf (8130) and gas or vapor is drawn out of the hollow rectangular chamber (8120) into the output plenum (8160) along the entire substrate longitudinal length, and the exiting gas or vapor is drawn into the exit port module (8180). Accordingly the reaction chamber assembly (8100) can be used to perform a coating cycle to deposit solid material layers onto six substrates at one time.

The substrate support shelves (8130) are supported in two stacks of three trays each with side by side substrate trays being substantially coplanar. Substrate support shelves are supported at each end by a three shelve support brackets (8220A, 8220B and 8220C). Referring to FIG. 16B an enlarged view of the chamber input side shows the shelf support bracket (8220C), three substrate support shelves (8130) supported by the shelf support bracket (8220C) and three substrates (8230) supported one supported on each of the substrate support shelves. Each substrate support shelve includes a shoulder (8240) formed at each end of the shelf, (only one shown) and substrates are supported slightly overhanging the shoulder (8240) at each end. The shoulder and related overhang is used to insert a lifting or manipulating tool to load a substrate onto a shelf or to unload the substrate from the shelf.

Each substrate support shelf may be individually heated by a heating element, (not shown), associated with and preferably attached to the substrate support shelf. In addition, the chamber assembly (8100) may also include an electrical connector (8250) associated with each of the substrate support shelves to supply power to the heating elements. Preferably, each substrate support shelf (8130) comprises ALPASE K100-S, which is an aluminum plate material specifically designed for vacuum applications and provides a relatively high thermal conductivity (e.g. 812 BTU-in/hr-ft$^2$-° F.) to quickly and uniformly conduct thermal energy between heating elements and substrates supported on the shelves. Alternately, the substrate trays (8130) can be fabricated from stainless steel so that the substrate support shelves can be cleaned by mechanical abrasion or chemical etching and reused.

The reaction chamber assembly (8100) may also include a removable cleanable liner (8260) disposed inside the outer wall assembly surrounding the substrate support areas (8140, 8150) and configured to prevent process gasses from contaminating internal walls of the outer wall assembly.

The invention claimed is:

1. A reaction chamber assembly for depositing thin film layers onto one or more substrates comprising:
    an outer wall assembly for enclosing a hollow chamber comprising substantially opposing top and bottom outer walls attached to substantially opposing left and right outer side walls and substantially opposing front and back outer walls;
    a gas supply module for delivering one or more gas and vapor phase materials into the hollow chamber;
    a vacuum pump for removing gas and vapor phase materials from the hollow chamber;
    an input rectangular aperture extending through one of the left and right outer side walls;
    an output rectangular aperture extending through the other of the left and right outer side walls wherein the input rectangular aperture and the output rectangular aperture are opposing and the input rectangular aperture has substantially identical aperture dimensions as the output rectangular aperture;
    an input plenum disposed external to the outer wall assembly comprising an input end and in fluid communication with the gas supply module for delivering the one or more gas and vapor phase materials into the hollow chamber through the input rectangular aperture, wherein the input plenum is shaped to expand a volume of the gas and vapor phase materials passing from the input end to the input rectangular aperture, the input plenum further including an output end opposite the input end and defining an input plenum chamber between the two ends and wherein the input plenum chamber has a triangular cross-section in a substantially horizontal plane with the input end forming an apex of the triangular cross-section and the output end forming a base of the triangular cross-section, and wherein the input plenum chamber has a trapezoidal cross-section in a substantially vertical plane where the trapezoidal cross-section increases in height from the input end to the output end;

an output plenum disposed external to the outer wall assembly and in fluid communication with the vacuum pump for removing gas and vapor phase materials from the hollow chamber through the output rectangular aperture;

wherein the output plenum forms an output plenum chamber having an output end for removing the one or more gas and vapor phase materials out of the output plenum chamber through an exit port module disposed proximate to the output end;

wherein the output plenum is formed with an input end for withdrawing the one or more gas and vapor phase materials out of the hollow chamber through the output rectangular aperture substantially over an entire area of the aperture dimensions of the output rectangular aperture;

wherein the output plenum chamber is formed with a shape that causes a velocity of the one or more gas and vapor phase materials flowing there through to increase as the gas approaches the exit port module, and;

one or more substrate support surfaces substantially horizontally disposed inside the hollow chamber and between the input rectangular aperture and the output rectangular aperture.

2. The reaction chamber assembly of claim 1 further comprising:
a front aperture passing through the front outer wall for providing access to the hollow chamber for loading and unloading the one or more substrates; and,
an access door movable with respect to the front aperture for gas sealing the front aperture during deposition coating cycles when the access door is closed and for providing access to the hollow volume through the front aperture when the access door is opened.

3. The reaction chamber assembly of claim 1 wherein the output plenum chamber has a first triangular cross-section substantially in a horizontal plane with the output end forming an apex of the first triangular cross-section and the input end forming a base of the first triangular cross-section.

4. The reaction chamber assembly of claim 1 wherein the exit port module comprises:
a circular exit port passing through one of a top and a bottom output plenum wall;
a pressure gage for sensing gas pressure inside the exit port module; and,
a stop valve for isolating the exit port module from the vacuum pump when the stop valve is in a closed position.

5. The reaction chamber of claim 1 wherein the hollow volume has a first rectangular cross-section in a substantially horizontal plane with a hollow volume longitudinal length and a hollow volume transverse width wherein each of the one or more substrate support surfaces has rectangular dimensions with a support surface longitudinal length and a support surface transverse width each sized to fit inside the hollow volume first rectangular cross-section and to support a rectangular substrate having rectangular dimensions defined anyone of the substrate size standards GEN 1 (300×400 mm) through GEN 7 (2160×2460 mm).

6. The reaction chamber of claim 1 further comprising a liner assembly disposed inside the hollow chamber and wherein the liner assembly when assembled together is installable into the hollow chamber as a unit.

7. The reaction chamber assembly of claim 6 wherein the liner assembly includes a substantially horizontally disposed liner base wall positioned between the left and right apertures and wherein the liner base wall comprises at least one of the one or more substrate support surfaces.

8. The reaction chamber assembly of claim 7 wherein the liner assembly comprises a liner base wall opposing a liner top wall, a liner front wall opposing a liner back wall and two opposing liner side walls wherein the base wall and the top wall are coupled together with each of the liner front wall, liner back wall and two opposing liner side walls and wherein each of the liner base wall, the liner top wall, the liner front wall, the liner back wall and the two liner side walls is fabricated from a material that is cleanable by an acid etch to remove built up atomic layer deposition layers from inside surfaces thereof.

9. The reaction chamber of claim 7 further comprising a back aperture passing through a back outer wall of the outer wall assembly wherein the liner assembly when assembled together as a unit can be installed into the hollow chamber through the back aperture.

10. The reaction chamber of claim 1 further comprising an output plenum liner comprising a rectangular tube shaped element installed through the output rectangular output aperture.

11. The reaction chamber of claim 1 further comprising a trap disposed between the output plenum and the vacuum pump wherein the trap includes a catalytically active hydrocarbon (He) oxidation matrix suitable for reacting with undesirable hydrocarbon gases being withdrawn from the exit plenum.

12. The reaction chamber of claim 1 further comprising a precursor trap disposed between the output plenum and the vacuum pump wherein the precursor trap comprises a high surface area matrix heated to a reaction temperature suitable for reacting with unreacted precursor materials exiting from the output plenum.

* * * * *